(12) United States Patent
Taniguchi

(10) Patent No.: US 10,110,191 B2
(45) Date of Patent: Oct. 23, 2018

(54) HIGH-FREQUENCY LAMINATED COMPONENT AND LAMINATED HIGH-FREQUENCY FILTER

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 144 days.

(21) Appl. No.: 14/868,491

(22) Filed: Sep. 29, 2015

(65) Prior Publication Data

US 2016/0020746 A1   Jan. 21, 2016

Related U.S. Application Data

(60) Division of application No. 13/596,114, filed on Aug. 28, 2012, now Pat. No. 9,184,720, which is a
(Continued)

(30) Foreign Application Priority Data

Mar. 18, 2010 (JP) .................................. 2010-061803
Mar. 19, 2010 (JP) .................................. 2010-064264

(51) Int. Cl.
*H03H 7/01* (2006.01)
*H03H 7/09* (2006.01)
(Continued)

(52) U.S. Cl.
CPC ........... *H03H 7/0115* (2013.01); *H01F 38/14* (2013.01); *H03H 7/09* (2013.01); *H03H 7/1708* (2013.01);
(Continued)

(58) Field of Classification Search
CPC .. H03H 2001/0085; H03H 7/01; H03H 7/175; H03H 7/0115; H03H 38/14;
(Continued)

(56) References Cited

U.S. PATENT DOCUMENTS

2003/0147197 A1* 8/2003 Uriu ...................... H01P 1/2039
                                                               333/185
2010/0214037 A1† 8/2010 Plager et al.

FOREIGN PATENT DOCUMENTS

JP  WO 2009096474 A1 * 8/2009 ........... H03H 7/0123
WO        2008/143071     † 11/2008

OTHER PUBLICATIONS

Taniguchi, "High-Frequency Laminated Component and Laminated High-frequency Filter" U.S. Appl. No. 13/596,114, filed Aug. 28, 2012.

* cited by examiner
† cited by third party

*Primary Examiner* — Benny Lee
*Assistant Examiner* — Hafizur Rahman
(74) *Attorney, Agent, or Firm* — Keating & Bennett, LLP

(57) ABSTRACT

A laminate defining a high-frequency laminated component includes a ground electrode on a bottom surface of a lowermost insulating layer. A second insulating layer includes an inner-layer ground electrode arranged over substantially the entire surface thereof. A portion from a third insulating layer to a fifth insulating layer is provided with a capacitor electrode defining a series capacitor of a ground impedance adjustment circuit and capacitor electrodes defining a first parallel capacitor and a second parallel capacitor. A sixth insulating layer has an inner-layer ground electrode provided over substantially the entire surface
(Continued)

thereof. The inner-layer ground electrodes are arranged in electrical continuity with the ground electrode by via holes.

19 Claims, 22 Drawing Sheets

Related U.S. Application Data continuation of application No. PCT/JP2011/054089, filed on Feb. 24, 2011.

(51) Int. Cl.
*H01F 38/14* (2006.01)
*H01G 4/40* (2006.01)
*H03H 1/00* (2006.01)

(52) U.S. Cl.
CPC ........ *H03H 7/1725* (2013.01); *H03H 7/1766* (2013.01); *H03H 7/1775* (2013.01); *H03H 7/1791* (2013.01); *H01F 2038/146* (2013.01); *H01G 4/40* (2013.01); *H03H 2001/0085* (2013.01)

(58) Field of Classification Search
CPC ...... H03H 7/09; H03H 7/1708; H03H 7/1725; H03H 7/1766; H03H 7/1775; H03H 7/1791; H01F 2038/146; H01G 4/40
USPC ............... 333/175, 185; 174/260; 361/275.1, 361/301.4, 305, 321.1, 303, 311; 29/25.03
See application file for complete search history.

FIG. 5B
FIG. 5A
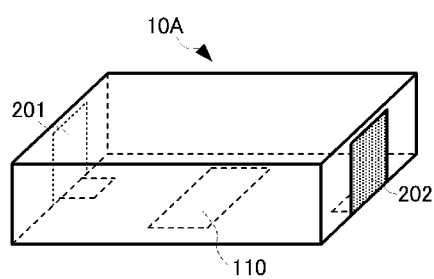
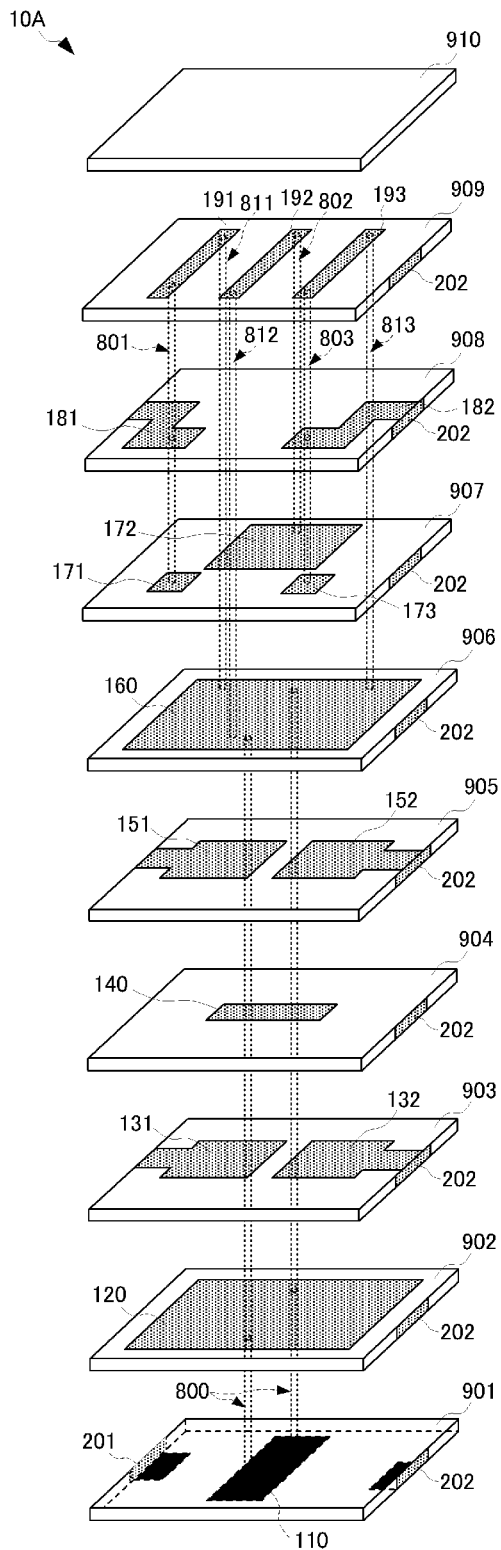

STRUCTURE OF PRESENT EMBODIMENT

CONVENTIONAL STRUCTURE

| NUMBER OF COIL LAYERS | INSERTION LOSS |
|---|---|
| ONE LAYER | 3.45 dB |
| TWO LAYERS | 2.70 dB |
| THREE LAYERS | 2.37 dB |
| FOUR LAYERS | 2.30 dB |

HIGH-FREQUENCY LAMINATED COMPONENT AND LAMINATED HIGH-FREQUENCY FILTER

BACKGROUND OF THE INVENTION

1. Field of the Invention

The present invention relates to a high-frequency laminated component realizing a desired circuit function by providing electrodes in predetermined patterns on a plurality of insulating layers, and also relates to a laminated high-frequency filter including the high-frequency laminated component.

2. Description of the Related Art

In the past, various types of high-frequency laminated components have been used in wireless devices, such as cellular phones. As indicated in Japanese Unexamined Patent Application Publication No. 8-46401, for example, a high-frequency laminated component has a laminated structure including a plurality of insulating layers.

In the high-frequency laminated component, predetermined electrode patterns are formed on the plurality of insulating layers to form inductors and capacitors. Further, the inductors and the capacitors formed by these electrode patterns are connected by other electrode patterns to realize a circuit function, such as a band pass filter, for example.

The above-described high-frequency laminated component is used as mounted on or in another circuit board, and thus includes terminal electrodes for mounting. The terminal electrodes are normally formed on end surfaces (side surfaces) or a bottom surface of the high-frequency laminated component. It is therefore necessary to provide routing electrodes for connecting the electrode patterns forming a circuit function section, which includes the above-described inductors and capacitors, and the terminal electrodes. For example, in Japanese Unexamined Patent Application Publication No. 8-46401, to connect electrode patterns on a predetermined layer to a ground electrode on a bottom surface, electrodes for connecting these elements are formed on end surfaces (side surfaces) of a laminate.

Meanwhile, in the laminated structure described in Japanese Unexamined Patent Application Publication No. 8-46401, for example, the routing electrodes between the electrodes forming the circuit function section and the ground electrode are increased in length, and the influence of a parasitic inductor Lg is increased. If the parasitic inductor Lg is present, the attenuation characteristic in a high-frequency band is deteriorated. Therefore, a desired transmission characteristic fails to be obtained, even if the laminated structure configures a filter, such as a band pass filter, for example.

As a method of solving above-described problem of the parasitic inductor Lg, a ground impedance adjustment circuit as illustrated in FIG. 1 is provided. FIG. 1 illustrates an equivalent circuit of a high-frequency laminated component including a ground impedance adjustment circuit.

As illustrated in FIG. 1, the high-frequency laminated component includes first and second input/output terminals Pio1 and Pio2, a circuit function section, and a parasitic inductor Lg, and also includes a ground impedance adjustment circuit having three capacitors C1, C2, and C12 connected in a π-shape. With the provision of the above-described ground impedance adjustment circuit, it is possible to form an attenuation pole in a desired frequency band, and thus to prevent the deterioration of the attenuation characteristic in a high-frequency band due to the parasitic inductor Lg.

Further, as a laminated high-frequency filter formed by a high-frequency laminated component similarly having a plurality of insulating layers laminated, there is a structure described in International Publication No. WO 2007-119356, for example.

In a laminated high-frequency filter described in International Publication No. WO 2007-119356, predetermined electrode patterns are formed on a plurality of insulating layers to form inductors and capacitors. The inductors and the capacitors formed by these electrode patterns form a plurality of LC resonators. In the plurality of LC resonators, LC resonators on the opposite sides are respectively connected to input/output terminals, and the respective inductors of adjacent LC resonators are electromagnetic field-coupled. Thereby, a filter circuit including a plurality of stages of LC resonators is formed.

The above-described filter circuit occasionally includes a skip-coupling capacitor for capacitance-coupling the input/output terminals on the opposite sides by skipping a plurality of stages of LC resonators, to thereby obtain a desired characteristic.

Further, an electrode forming the skip-coupling capacitor is formed into an elongated shape extending in a direction of connecting opposite end portions of a laminate formed with input/output electrodes serving as the input/output terminals, as in an electrode indicated as 160 in FIG. 42 and an electrode indicated as 260 in FIG. 45 of International Publication No. WO 2007-119356.

When the above-described ground impedance adjustment circuit is formed on or in a laminated substrate, however, the following problem arises. FIG. 2 is a diagram illustrating a laminate 10P of a conventional ground impedance adjustment circuit. FIG. 3 is a diagram illustrating a transmission characteristic of the ground impedance adjustment circuit having the structure of FIG. 2. FIG. 4A is an equivalent circuit diagram of a band pass filter including three stages of LC resonators. FIG. 4B is a transmission characteristic diagram of a case where the band pass filter illustrated in FIG. 4A is configured with the use of the ground impedance adjustment circuit having the conventional structure.

As illustrated in FIG. 2, the laminate 10P of the ground impedance adjustment circuit has a laminated structure of five insulating layers 901P to 905P. The lowermost (first) insulating layer 901P is formed with input/output electrodes 201 and 202 and a ground electrode 110. The ground electrode 110 is formed on a bottom surface of the insulating layer 901P, and the input/output electrodes 201 and 202 are formed to respectively extend from two facing end surfaces of the insulating layer 901P to the bottom surface. The input/output electrodes 201 and 202 are formed on the end surfaces of the respective layers excluding the uppermost (fifth) insulating layer 905P.

The second insulating layer 902P is formed with an inner-layer ground electrode 120. The inner-layer ground electrode 120 is connected to the ground electrode 110 by conductive via holes.

The third insulating layer 903P is formed with capacitor electrodes 131 and 132, and is further formed with a routing electrode for connecting the capacitor electrode 131 and the not-illustrated input/output electrode 201 and a routing electrode for connecting the capacitor electrode 132 and the input/output electrode 202.

The fourth insulating layer 904P is formed with a capacitor electrode 140.

With the above-described structure, a region in which the capacitor electrode 131 and the inner-layer ground electrode 120 face each other corresponds to the capacitor C1 in FIG.

1. A region in which the capacitor electrode 132 and the inner-layer ground electrode 120 face each other corresponds to the capacitor C2 in FIG. 1. A region in which the capacitor electrode 140 and the capacitor electrodes 131 and 132 face each other corresponds to the capacitor C12 in FIG. 1. Further, when a device including this ground impedance adjustment circuit is mounted on or in a printed board or the like, the potential difference between the ground potential of the printed board and the ground potential of the ground impedance adjustment circuit corresponds to the parasitic inductor Lg. In the above-described configuration, therefore, an inductor due to the via holes is included in the parasitic inductor Lg.

As illustrated in FIG. 3, in the above-described structure, the capacitors forming the ground impedance adjustment circuit have a self-resonance point in a high-frequency band, which is caused particularly by the capacitors C1 and C2. The capacitors C1 and C2 are coupled by the capacitor C12, and thereby the transmission characteristic, which is supposed to have been improved, is locally deteriorated. For example, in the capacitor C1, the self-resonance occurs owing to residual inductance of the capacitor electrode 131 and capacitance formed between the capacitor electrode 131 and the ground electrode 120.

Therefore, even if the band pass filter as illustrated in FIG. 4A is configured with the use of the above-described ground impedance adjustment circuit, a resonance point is generated in an attenuation band, as illustrated in FIG. 4B, and a favorable frequency characteristic fails to be obtained.

Further, as indicated in International Publication No. WO 2007-119356, the electrodes forming the inductors of the LC resonators are disposed at predetermined intervals along the direction of connecting the aforementioned opposite end portions. If an electrode forming the skip-coupling capacitor has the above-described shape, therefore, the electrode is provided across a plurality of electrodes for inductors, as viewed in the lamination direction.

In the above-described structure, the electrode forming the skip-coupling capacitor exerts substantial influence on the coupling between the inductors, and the insertion loss is increased. Thereby, characteristics of the filter (transmission characteristic and attenuation characteristic) are deteriorated.

SUMMARY OF THE INVENTION

In view of the various problems as described above, preferred embodiments of the present invention provide a high-frequency laminated component and a laminated high-frequency filter having superior characteristics by significantly reducing and preventing the generation of a resonance point and significantly reducing and preventing a factor in the increase in insertion loss.

According to a preferred embodiment of the present invention, a high-frequency laminated component includes a pair of input/output terminals; a circuit function section connected between the pair of input/output terminals and performing a predetermined function; and a ground impedance adjustment circuit including a series capacitor connected between the pair of input/output terminals, and a first parallel capacitor and a second parallel capacitor respectively connected between the opposite ends of the series capacitor and a ground. In this high-frequency laminated component, at least the ground impedance adjustment circuit includes a laminate of a plurality of laminated insulating layers including predetermined electrode patterns disposed thereon.

This high-frequency laminated component further includes at least inner-layer ground electrodes respectively located on different insulating layers of the laminate. Electrodes defining the parallel capacitors are disposed between the inner-layer ground electrodes.

In this configuration, the parallel capacitors are sandwiched between two inner-layer ground electrodes, and thereby self-resonance of the parallel capacitors is significantly reduced and prevented. Accordingly, a resonance point as illustrated in FIG. 4B is significantly reduced and prevented.

Further, according to the high-frequency laminated component of a preferred embodiment of the present invention, in the first parallel capacitor and the second parallel capacitor, which are each defined by opposite electrodes facing each other, one of the opposite electrodes is defined by the inner-layer ground electrodes. The other one of the opposite electrodes of the first parallel capacitor and the second parallel capacitor is disposed between the two inner-layer ground electrodes.

In this configuration, the one of the opposite electrodes of the first parallel capacitor and the second parallel capacitor directly serves as a ground electrode, and these capacitors are also sandwiched between the inner-layer ground electrodes. Accordingly, it is possible to further improve the frequency characteristic.

Further, in the high-frequency laminated component of a preferred embodiment of the present invention, the other one of the opposite electrodes of the first parallel capacitor and the second parallel capacitor also serves as one of opposite electrodes of the series capacitor, which is defined by the opposite electrodes facing each other.

In this configuration, routing electrodes between the series capacitor and the first and second parallel capacitors are omitted. Thereby, the frequency characteristic is further improved, and a further reduction in size is attained.

Further, in the high-frequency laminated component of a preferred embodiment of the present invention, the circuit function section is a filter having a predetermined frequency transmission characteristic. In this configuration, a specific example of the circuit function section is presented. With the circuit function section thus configured as a filter, the configuration of the present application operates more effectively.

Further, in the high-frequency laminated component of a preferred embodiment of the present invention, the circuit function section includes electrode patterns located on the plurality of insulating layers. In this configuration, a specific shape of the circuit function section is presented. With the circuit function section thus provided in the laminate, the high-frequency laminated component is realized only by a single laminate.

Further, in the high-frequency laminated component of a preferred embodiment of the present invention, the circuit function section includes a capacitor, and at least one of the series capacitor, the first parallel capacitor, and the second parallel capacitor defining the ground impedance adjustment circuit also serves as the capacitor.

In this configuration, a specific shape of the circuit function section including a capacitor is presented. With the circuit function section and the ground impedance adjustment circuit thus at least partially sharing elements of each other, a reduction in size is attained.

Further, in the high-frequency laminated component of a preferred embodiment of the present invention, the circuit function section includes a mounted component mounted on the laminate. The laminate includes a mounting land to mount the mounted component.

In this configuration, a specific shape of the circuit function section is presented. With the circuit function section thus provided by a mounted component, it is possible to easily change, as required, circuit devices defining the circuit function section, and to realize a superior frequency characteristic regardless of the change.

According to another preferred embodiment of the present invention, a high-frequency laminated component includes a pair of input/output terminals; and a ground impedance adjustment circuit including a series capacitor connected between the pair of input/output terminals, and a first parallel capacitor and a second parallel capacitor respectively connected between the opposite ends of the series capacitor and a ground. In this high-frequency laminated component, the ground impedance adjustment circuit includes a laminate of a plurality of laminated insulating layers provided with predetermined electrode patterns.

This high-frequency laminated component further includes at least two inner-layer ground electrodes respectively located on different intermediate layers of the laminate. Electrodes defining the series capacitor are disposed between the two inner-layer ground electrodes.

In this configuration, a case where the high-frequency laminated component is provided only by the ground impedance adjustment circuit is presented. With the use of the thus configured high-frequency laminated component, it is possible to improve the frequency characteristic of a separate circuit function section connected to the component.

Further, in the high-frequency laminated component of a preferred embodiment of the present invention, one of opposite electrodes of the first parallel capacitor and the second parallel capacitor is defined by the inner-layer ground electrodes. The other one of the opposite electrodes of the first parallel capacitor and the second parallel capacitor is disposed between the two inner-layer ground electrodes.

According to this configuration, in the high-frequency laminated component defined only by the ground impedance adjustment circuit, the one of the opposite electrodes of the first parallel capacitor and the second parallel capacitor directly serves as a ground electrode, and these capacitors are also sandwiched between the inner-layer ground electrodes. Accordingly, it is possible to further improve the frequency characteristic.

Further, in the high-frequency laminated component of a preferred embodiment of the present invention, the other one of the opposite electrodes of the first parallel capacitor and the second parallel capacitor also serves as one of opposite electrodes of the series capacitor.

According to this configuration, in the high-frequency laminated component defined only by the ground impedance adjustment circuit, routing electrodes between the series capacitor and the first and the second parallel capacitors are omitted. Accordingly, the frequency characteristic is further improved, and a further reduction in size is attained.

According to a further preferred embodiment of the present invention, a laminated high-frequency filter includes a pair of input/output terminals, a plurality of stages of LC resonators connected in a high-frequency manner between the pair of input/output terminals, and a skip-coupling capacitor directly connected between the pair of input/output terminals. In the laminated high-frequency filter, inductors and capacitors defining the LC resonators and the skip-coupling capacitor include a laminate of a plurality of laminated insulating layers provided with predetermined electrode patterns.

Further, in the laminated high-frequency filter of a preferred embodiment of the present invention, an inner-layer ground electrode is provided between electrode patterns defining the inductors and electrode patterns defining the skip-coupling capacitor.

In this configuration, the electrode patterns defining the skip-coupling capacitor do not affect the coupling between the inductors of the plurality of LC resonators. Accordingly, it is possible to obtain desired coupling between the inductors, and to prevent an increase in insertion loss.

Further, the laminated high-frequency filter of a preferred embodiment of the present invention includes input/output capacitors respectively connected between the pair of input/output terminals and a ground. In the laminated high-frequency filter, the input/output capacitors include electrode patterns of the laminate, and at least the skip-coupling capacitor is sandwiched by inner-layer ground electrodes formed on different insulating layers.

In this configuration, the input/output capacitors and the skip-coupling capacitor define a π-shaped circuit. With the thus configured π-shaped circuit, it is possible to improve the attenuation characteristic. Particularly, with the parallel capacitors of the π-shape sandwiched between the inner-layer ground electrodes, it is possible to significantly reduce and prevent the self-resonance of the parallel capacitors. Accordingly, it is possible to further improve the attenuation characteristic.

Further, in the laminated high-frequency filter of a preferred embodiment of the present invention, the electrode patterns defining the input/output capacitors are also provided as sandwiched by the inner-layer ground electrodes located on the different insulating layers.

In this configuration, with all of the capacitors sandwiched between the inner-layer ground electrodes, it is possible to further improve the attenuation characteristic.

Further, in the laminated high-frequency filter of a preferred embodiment of the present invention, the opposite ends of the electrode patterns in the inductors of the LC resonators include via holes to be connected to the capacitors of the LC resonators and a ground, and each of the inductors is defined by the electrode pattern of the inductor and two via holes.

In this configuration, each of the inductors is defined by an electrode pattern and two via holes connected to the electrode pattern. As a result, the electrodes of the inductors extend in a loop shape, and it is possible to reinforce the coupling between the inductors. Further, with the electrodes of the inductors arranged into a loop shape, it is possible to improve the Q value of the inductors, and to improve the insertion loss of the filter.

Further, in the laminated high-frequency filter of a preferred embodiment of the present invention, the via holes connected to the electrode patterns of the inductors are located at respective positions at which the via holes substantially overlap one another, as viewed from a side surface of the laminate.

In this configuration, it is possible to reduce the interval between the via holes defining adjacent inductors. Accordingly, it is possible to reinforce the coupling between the inductors.

Further, in the laminated high-frequency filter of a preferred embodiment of the present invention, the electrode patterns forming the inductors are provided on a plurality of insulating layers. Each of the electrode patterns provided on the plurality of insulating layers is connected in parallel to the two via holes.

In this configuration, with the presence of a plurality of electrode patterns, it is possible to further reinforce the coupling between the inductors.

Further, in the laminated high-frequency filter of a preferred embodiment of the present invention, the ground to which the electrode patterns of the inductors are connected is an inner-layer ground electrode included on a predetermined insulating layer different from a bottom surface of the laminate.

In this configuration, the inductors are not directly connected to a ground electrode for external connection. It is therefore possible to reduce an eddy current loss attributed to the ground electrode.

Further, in the laminated high-frequency filter of a preferred embodiment of the present invention, the inner-layer ground electrode to which the electrode patterns of the inductors are connected is the inner-layer ground electrode provided between the electrode patterns defining the inductors and the electrode patterns defining the skip-coupling capacitor.

In this configuration, the inner-layer ground electrode dividing the above-described inductors and the skip-coupling capacitor also serves the ground to which the inductors are connected. It is therefore possible to reduce the constituent elements of the laminate.

Further, in the laminated high-frequency filter of a preferred embodiment of the present invention, in arbitrary adjacent inductors of the inductors defining the plurality of LC inductors, connection positions of the electrode patterns connected to the via holes connected to the capacitors are located at different end portions.

In this configuration, it is possible to set the respective current flow directions of the adjacent inductors to be opposite to each other.

Further, in the laminated high-frequency filter of a preferred embodiment of the present invention, the electrode patterns of arbitrary adjacent inductors of the inductors defining the plurality of LC inductors are located on the same insulating layer.

In this configuration, with the electrode patterns of the adjacent inductors being in proximity to each other, it is possible to reinforce the coupling between the inductors.

Further, in the laminated high-frequency filter of a preferred embodiment of the present invention, an external ground electrode to be connected to an external ground and external input/output terminals defining the pair of input/output terminals are provided in an array on a bottom surface of the laminate.

In this configuration, the electrode used to mount the laminated high-frequency filter on or in an external circuit board is provided on the bottom surface of the laminate. It is therefore possible to reduce the mounting area.

Further, the laminated high-frequency filter of a preferred embodiment of the present invention includes a ground impedance adjustment circuit including a series capacitor connected between the pair of input/output terminals, and a first parallel capacitor and a second parallel capacitor respectively connected between the opposite ends of the series capacitor and a ground. The electrode patterns defining the skip-coupling capacitor also serve as the series capacitor.

In this configuration, the series capacitor of the ground impedance adjustment circuit and the skip-coupling capacitor serve as elements of each other. It is therefore possible for the laminated high-frequency filter to have a smaller size.

According to various preferred embodiments of the present invention, it is possible to significantly reduce and prevent the generation of a resonance point, even with the use of a ground impedance adjustment circuit defined by a π-shaped circuit of capacitors. Further, according to various preferred embodiments of the present invention, it is possible to significantly reduce and prevent unnecessary coupling between electrode patterns in a laminate, and to significantly reduce and prevent a factor in the increase in insertion loss. Accordingly, it is possible to realize a high-frequency laminated component and a laminated high-frequency filter having superior characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A and 5B are an external perspective view of a high-frequency laminated component of a first preferred embodiment of the present invention, and a diagram illustrating a laminated configuration thereof.

DETAILED DESCRIPTION OF THE PREFERRED EMBODIMENTS

Figure 1:
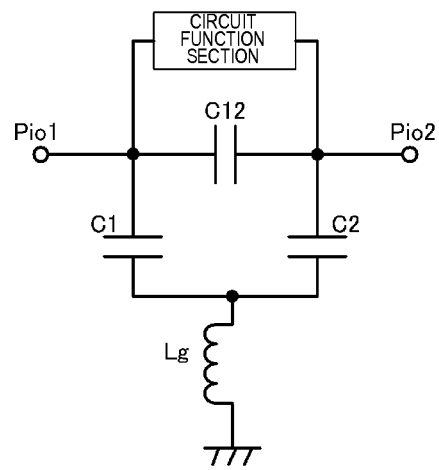
FIG. 1 illustrates an equivalent circuit of a conventional high-frequency laminated component including a ground impedance adjustment circuit.
Figure 2:
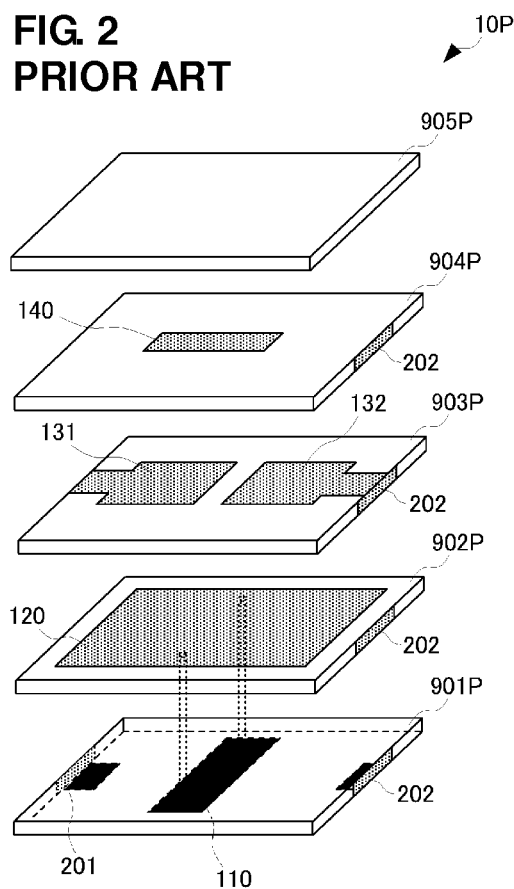
FIG. 2 is a diagram illustrating a laminated structure of a conventional ground impedance adjustment circuit.
Figure 3:
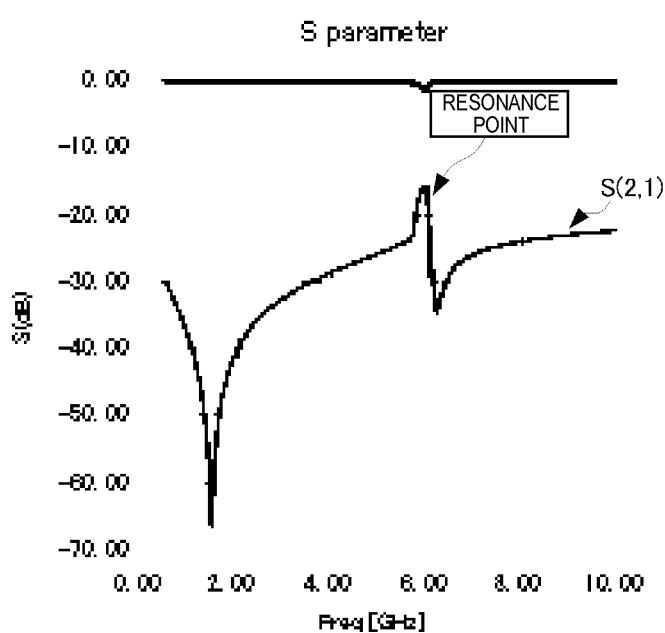
FIG. 3 is a diagram illustrating a transmission characteristic of the ground impedance adjustment circuit having the structure of FIG. 2.

A high-frequency laminated component according to a first preferred embodiment of the present invention will be described with reference to drawings. In the present preferred embodiment, description will be made with reference to a band pass filter (BPF) as an example of the high-frequency laminated component. FIG. 5A is an external perspective view of the high-frequency laminated component of the present preferred embodiment, and FIG. 5B is a diagram illustrating a laminated configuration of the high-frequency laminated component of the present preferred embodiment. The high-frequency laminated component 10A illustrated in FIGS. 5A and 5B is a band pass filter including three stages of parallel LC circuits, and an equivalent circuit thereof is the same as the above-described one in FIG. 4A.

The high-frequency laminated component 10A is defined by a laminate 10A including ten laminated insulating layers 901 to 910, for example. Each of the insulating layers 901 to 910 defining the laminate 10A preferably is a flat plate having a predetermined thickness (of micrometer order). One end surface of the laminate 10A is provided with an input/output electrode 201, and the other end surface of the laminate 10A facing the one end surface is provided with an input/output electrode 202. Further, in the following, side surfaces provided with the input/output electrodes 201 and 202 will be referred to as "end surfaces," and side surfaces perpendicular thereto will be referred to as "side surfaces."

The lowermost (first) insulating layer 901 includes the input/output electrodes 201 and 202 and a ground electrode 110. The ground electrode 110 is provided on a bottom surface of the insulating layer 901, and the input/output electrodes 201 and 202 are arranged to respectively extend from two facing end surfaces of the insulating layer 901 to the bottom surface. In FIGS. 5A and 5B, the input/output electrodes 201 and 202 are located on the end surfaces of the respective layers excluding the uppermost (tenth) insulating layer 910. The uppermost insulating layer 910 may also be provided with the input/output electrodes 201 and 202.

The second insulating layer 902 is provided with an inner-layer ground electrode 120. The inner-layer ground electrode 120 is arranged over substantially the entire surface of the insulating layer 902.

The third insulating layer 903 is provided with capacitor electrodes 131 and 132 each having a predetermined area. The third insulating layer 903 is provided with a routing electrode to connect the capacitor electrode 131 and the not-illustrated input/output electrode 201 on the one end surface. The third insulating layer 903 is provided with a routing electrode to connect the capacitor electrode 132 and the input/output electrode 202 on the other end surface.

The fourth insulating layer 904 is provided with a capacitor electrode 140. The capacitor electrode 140 is arranged to partially face the capacitor electrodes 131 and 132 of the third insulating layer 903.

The fifth insulating layer 905 includes capacitor electrodes 151 and 152 provided thereon similarly to the capacitor electrodes 131 and 132 of the third insulating layer 903. The capacitor electrode 151 is arranged to face the capacitor electrode 131, as viewed along the lamination direction. The capacitor electrode 152 is arranged to face the capacitor electrode 132, as viewed along the lamination direction. The fifth insulating layer 905 is provided with a routing electrode to connect the capacitor electrode 151 and the not-illustrated input/output electrode 201 on the one end surface. The fifth insulating layer 905 is provided with a routing electrode to connect the capacitor electrode 152 and the input/output electrode 202 on the other end surface.

The sixth insulating layer 906 is provided with an inner-layer ground electrode 160. The inner-layer ground electrode 160 is arranged over substantially the entire surface of the insulating layer 906.

The seventh insulating layer 907 includes capacitor electrodes 171, 172, and 173 each having a predetermined area.

The eighth insulating layer 908 includes routing electrodes 181 and 182 for input and output. The routing electrode 181 is connected to the not-illustrated input/output electrode 201 on the one end surface. The routing electrode 182 is connected to the input/output electrode 202 on the other end surface.

The ninth insulating layer 909 includes linear electrodes 191, 192, and 193 for inductors. Each of the linear electrodes 191, 192, and 193 has a shape extending in a direction along the end surfaces. The linear electrodes 191, 192, and 193 are spaced at predetermined intervals.

The tenth insulating layer 910 defining the uppermost layer is not provided with anything, and is a layer functioning as a cover of the laminate 10A.

The laminate 10A is further provided with a group of conductive via holes described below. As illustrated in FIGS. 5A and 5B, each of the via holes has a shape extending in the lamination direction.

Via holes 800 are arranged to connect the ground electrode 110 of the insulating layer 901, the inner-layer ground electrode 120 of the insulating layer 902, and the inner-layer ground electrode 160 of the insulating layer 906. The via holes 800 are provided at two locations near the respective facing side surfaces of the respective layers.

A via hole 801 is arranged to connect the routing electrode 181 of the insulating layer 908, the capacitor electrode 171 of the insulating layer 907, and the linear electrode 191. The via hole 801 is connected to a portion of the linear electrode 191 near one end thereof in the extending direction thereof.

A via hole 811 is arranged to connect the inner-layer ground electrode 160 of the insulating layer 906 and the linear electrode 191. The via hole 811 is connected to a portion of the linear electrode 191 near the other end thereof in the extending direction thereof.

A via hole 812 is arranged to connect the inner-layer ground electrode 160 of the insulating layer 906 and the linear electrode 192. The via hole 812 is connected to a portion of the linear electrode 192 near one end thereof in the extending direction thereof.

A via hole 802 is arranged to connect the capacitor electrode 172 of the insulating layer 907 and the linear electrode 192. The via hole 802 is connected to a portion of the linear electrode 192 near the other end thereof in the extending direction thereof.

A via hole 803 is arranged to connect the routing electrode 182 of the insulating layer 908, the capacitor electrode 173 of the insulating layer 907, and the linear electrode 193. The via hole 803 is connected to a portion of the linear electrode 193 near one end thereof in the extending direction thereof.

A via hole 813 is arranged to connect the inner-layer ground electrode 160 of the insulating layer 906 and the linear electrode 193. The via hole 813 is connected to a portion of the linear electrode 193 near the other end thereof in the extending direction thereof.

Figure 4A:
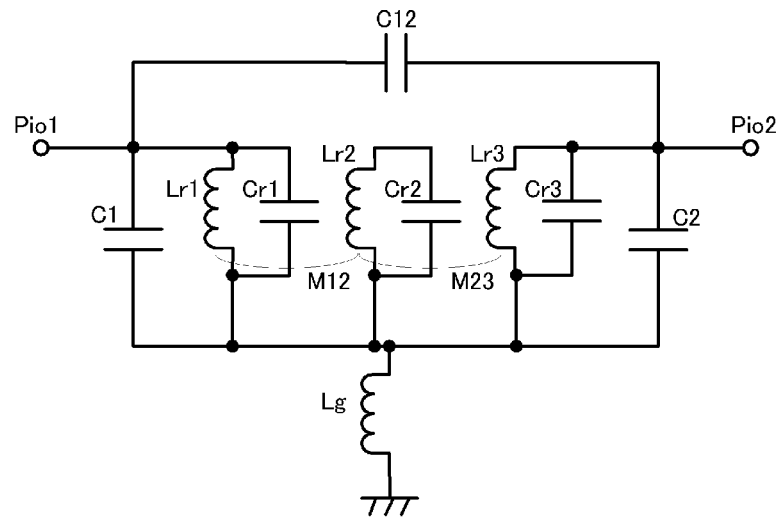
FIGS. 4A and 4B are an equivalent circuit diagram of a band pass filter including three stages of LC resonators, and a transmission characteristic diagram of a case where the band pass filter is configured with the use of the ground impedance adjustment circuit having the conventional structure.

With the above-described configuration, the input/output electrode 201 corresponds to a first input/output terminals Pio1 in FIG. 4A, and the input/output electrode 202 corresponds to a second input/output terminals Pio2 in FIG. 4A.

The combination of the capacitor electrode 131 and the inner-layer ground electrode 120 and the combination of the capacitor electrode 151 and the inner-layer ground electrode 160 correspond to a capacitor C1 in FIG. 4A (corresponding to a "first parallel capacitor" of a preferred embodiment of the present invention).

The combination of the capacitor electrode 132 and the inner-layer ground electrode 120 and the combination of the capacitor electrode 152 and the inner-layer ground electrode 160 correspond to a capacitor C2 in FIG. 4A (corresponding to a "second parallel capacitor" of a preferred embodiment of the present invention).

The combination of the capacitor electrode 140 and the capacitor electrodes 131 and 132 and the combination of the capacitor electrode 140 and the capacitor electrodes 151 and 152 correspond to a capacitor C12 in FIG. 4A (corresponding to a "series capacitor" of a preferred embodiment of the present invention). This capacitor C12 also serves as a "skip-coupling capacitor" of a preferred embodiment of the present invention.

With the above-described configuration, it is possible to configure a ground impedance adjustment circuit having the capacitors C12, C1, and C2 connected in a π-shape. Further, a structure is realized in which all of the capacitors C12, C1, and C2 of this ground impedance adjustment circuit are sandwiched by the two inner-layer ground electrodes 120 and 160 along the lamination direction.

The combination of the capacitor electrode 171 and the inner-layer ground electrode 160, the combination of the capacitor electrode 131 and the inner-layer ground electrode 120, and the combination of the capacitor electrode 151 and the inner-layer ground electrode 160 correspond to a resonant capacitor Cr1 in FIG. 4A. The combination of the capacitor electrode 173 and the inner-layer ground electrode 160, the combination of the capacitor electrode 132 and the inner-layer ground electrode 130, and the combination of the capacitor electrode 152 and the inner-layer ground electrode 160 correspond to a resonant capacitor Cr3 in FIG. 4A. The combination of the capacitor electrode 172 and the inner-layer ground electrode 160 corresponds to a resonant capacitor Cr2 in FIG. 4A.

The linear electrode 191 and the via holes 801 and 811 correspond to a resonant inductor Lr1 in FIG. 4A. As viewed from the end surface of the laminate 10A on the side of the input/output electrode 202, this resonant inductor Lr1 has a counterclockwise loop shape, with a side thereof connected to the inner-layer ground electrode 160 serving as a reference point.

The linear electrode 192 and the via holes 802 and 812 correspond to a resonant inductor Lr2 in FIG. 4A. As viewed from the end surface of the laminate 10A on the side of the input/output electrode 202, this resonant inductor Lr2 has a clockwise loop shape, with a side thereof connected to the inner-layer ground electrode 160 serving as a reference point.

The linear electrode 193 and the via holes 803 and 813 correspond to a resonant inductor Lr3 in FIG. 4A. As viewed from the end surface of the laminate 10A on the side of the input/output electrode 202, this resonant inductor Lr3 has a counterclockwise loop shape, with a side thereof connected to the inner-layer ground electrode 160 serving as a reference point.

Further, the linear electrode 191 with the via holes 801 and 811 and the linear electrode 192 with the via holes 802 and 812 are disposed at a predetermined interval, to thereby realize coupling inductance M12 in FIG. 4A. The linear electrode 192 with the via holes 802 and 812 and the linear electrode 193 with the via holes 803 and 813 are disposed at a predetermined interval, to thereby realize coupling inductance M23 in FIG. 4A.

Further, a portion of each of the via holes 800 between the ground electrode 110 and the inner-layer ground electrode 120 corresponds to a parasitic inductor Lg.

With the use of the laminated structure of the present preferred embodiment as described above, it is possible to realize a high-frequency laminated component of a laminated high-frequency filter integrally including three stages of LC resonators and a ground impedance adjustment circuit including the parasitic inductor Lg.

In the above-described configuration, the capacitors C12, C1, and C2 defining the ground impedance adjustment circuit are sandwiched by the inner-layer ground electrodes, as described above. It is thereby possible to significantly reduce and prevent self-resonance of these capacitors. The self-resonance tends to occur particularly when the electrode patterns are symmetrically arranged, as in the present preferred embodiment. If the capacitors are sandwiched by the inner-layer ground electrodes, however, it is possible to significantly reduce and prevent the self-resonance.

Figure 4B:
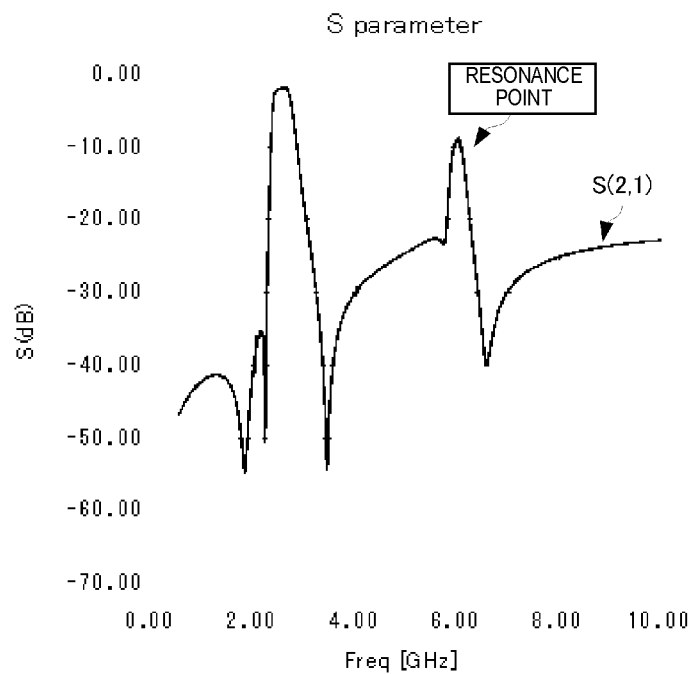
Figure 6:
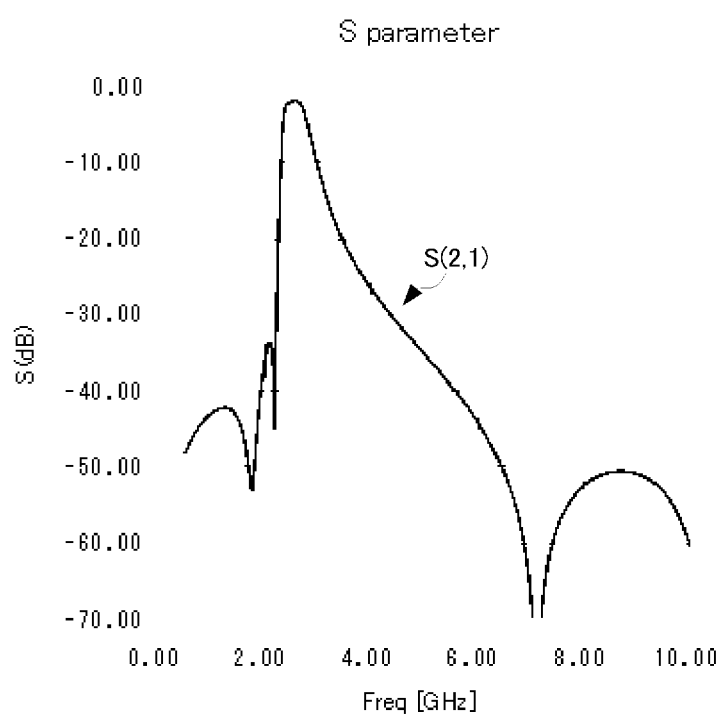
FIG. 6 is a transmission characteristic diagram of a band pass filter including three stages of LC resonators and having the structure of the first preferred embodiment of the present invention.

FIG. 6 is a transmission characteristic diagram of a band pass filter including three stages of LC resonators and having the structure of the present preferred embodiment. As illustrated in FIG. 6, with the use of the structure of the present preferred embodiment, it is possible to significantly reduce and prevent the generation of the resonance point as illustrated in FIG. 4B, which occurs in the conventional structure. Accordingly, it is possible to improve the attenuation characteristic on the higher-frequency side of the pass band. That is, it is possible to improve the frequency characteristic of the band pass filter.

Further, the inner-layer ground electrode 160 is provided between the linear electrode 191 and the via holes 801 and 811 of the resonant inductor Lr1, the linear electrode 192 and the via holes 802 and 812 of the resonant inductor Lr2, and the linear electrode 193 and the via holes 803 and 813 of the resonant inductor Lr3 and the capacitor electrode 140 of the skip-coupling capacitor. Thereby, the capacitor electrode 140 of the skip-coupling capacitor does not affect electromagnetic field coupling of the resonant inductors Lr1, Lr2, and Lr3. Accordingly, it is possible to significantly reduce and prevent the loss in the coupling of the resonant inductors Lr1, Lr2, and Lr3, and to reduce the insertion loss of the filter. Accordingly, it is possible to realize a laminated high-frequency filter having a superior band characteristic.

Figure 7A:
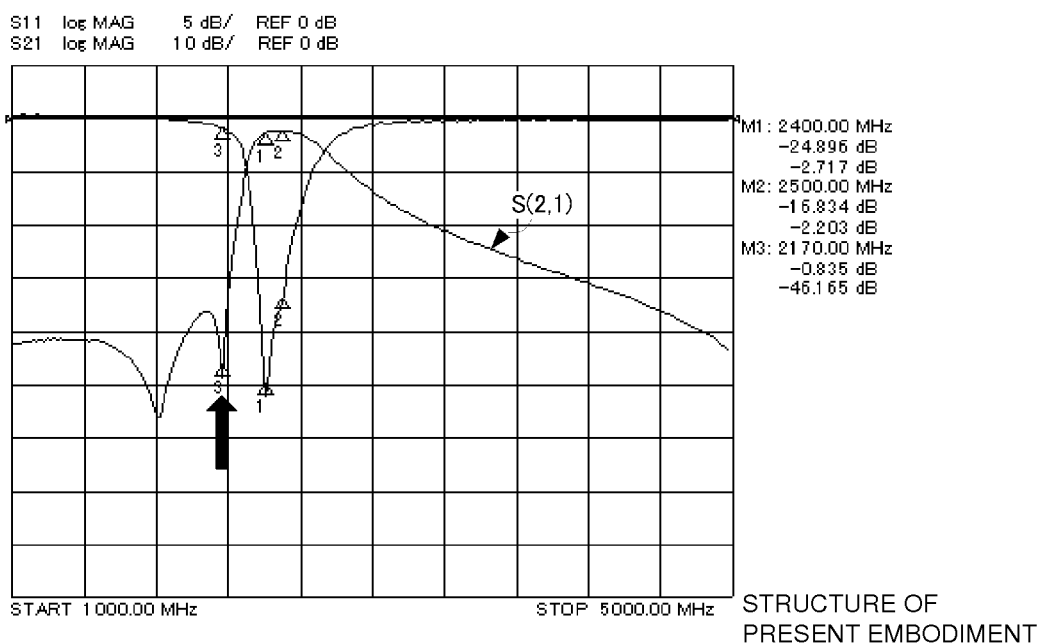
FIGS. 7A and 7B are a transmission characteristic diagram of a laminated high-frequency filter corresponding to the high-frequency laminated component of the first preferred embodiment of the present invention, and a transmission characteristic diagram of a conventional structure.
Figure 7B:
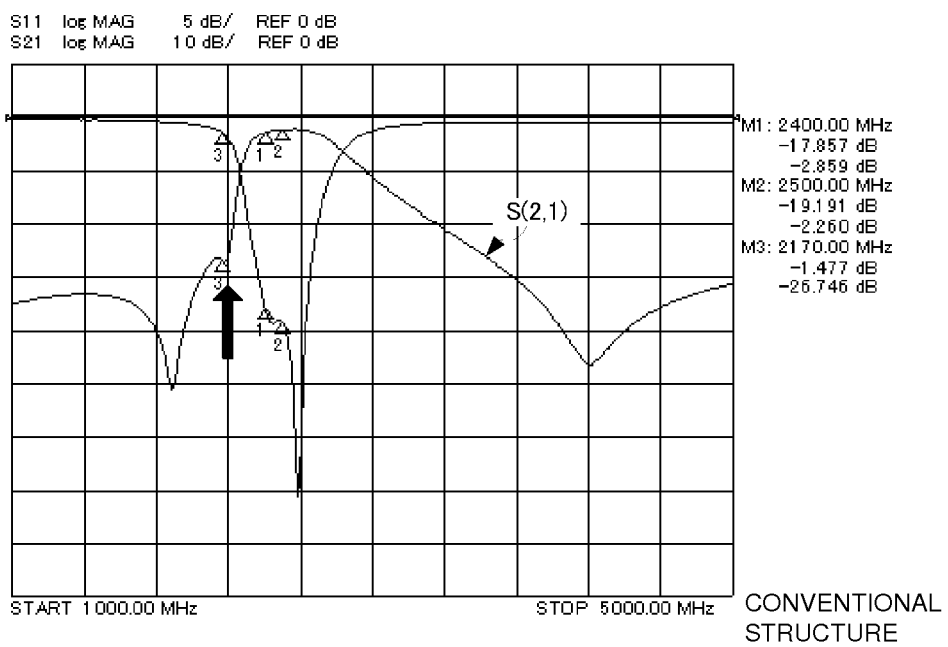

FIG. 7A is a transmission characteristic diagram of a band pass filter having the structure of the present preferred embodiment. FIG. 7B is a transmission characteristic diagram of a band pass filter having the conventional configuration and the same equivalent circuit.

As illustrated in FIGS. 7A and 7B, with the configuration of the present preferred embodiment, it is possible to provide an attenuation pole in an attenuation band near the low-frequency side of the pass band (near 2.2 GHz), in which the conventional structure is unable of form an attenuation pole. Accordingly, it is possible to improve the transmission characteristic and the attenuation characteristic of the filter, and to realize a laminated high-frequency filter having a superior band characteristic.

Further, as described above, the capacitor C12 defined by the capacitor electrode 140 functions, together with the capacitors C1 and C2, as the π-shaped circuit connected between the input/output terminals Pio1 and Pio2. Accordingly, it is possible to realize a ground impedance adjustment circuit improving the attenuation characteristic on the high-band side of the pass band. Consequently, it is possible to realize a laminated high-frequency filter having a further superior band characteristic.

Furthermore, as described above, the capacitor electrodes defining the capacitors C12, C1, and C2 are sandwiched between the inner-layer ground electrodes 120 and 160. It is therefore possible to significantly reduce and prevent the self-resonance of these capacitors, particularly the self-resonance of the capacitors C1 and C2 also functioning as the parallel capacitors. Accordingly, it is possible to realize a laminated high-frequency filter having a further superior band characteristic.

Further, the linear electrodes 191, 192, and 193 defining the resonant inductors Lr1, Lr2, and Lr3, respectively, are all preferably provided on the same insulating layer 909. It is therefore possible to reduce the intervals between the linear electrodes, as compared with a case where these linear electrodes are respectively located on different insulating layers. This also allows the coupling between the inductors to be reinforced.

Further, the via holes connected to the linear electrodes 191, 192, and 193 are arranged to overlap one another, as viewed from the end surfaces of the laminate 10A provided with the input/output electrodes 201 and 202. In this configuration, it is possible to reduce the distance between the via holes. This also allows the coupling between the inductors to be reinforced.

Further, the adjacent resonant inductors Lr1 and Lr2 are opposite to each other in the winding direction, with the inner-layer ground electrode 160 serving as a reference point. Further, the adjacent resonant inductors Lr2 and Lr3 are opposite to each other in the winding direction, with the inner-layer ground electrode 160 serving as a reference point. With the above-described coupling realized between the resonant inductors, it is possible to significantly reduce and prevent ripples in the pass band of the filter.

Further, the linear electrodes 191, 192, and 193 and the via holes 801, 811, 802, 812, 803, and 813 defining the inductors are directly connected to the inner-layer ground electrode 160, and are not directly connected to the external ground electrode 110 provided on the bottom surface of the laminate 10A. Accordingly, it is possible to significantly reduce and prevent an eddy current loss attributed to the external ground electrode 110. Consequently, it is possible to improve the Q of each of the LC resonators.

Further, with the use of the above-described structure, the capacitor C12 serves as both the skip-coupling capacitor and the series capacitor of the ground impedance adjustment circuit. It is therefore possible to reduce the constituent elements of the laminate 10A than in a case where these are separately provided. This allows the above-described laminated high-frequency filter having a superior band characteristic to have a smaller size.

Further, the inner-layer ground electrode 160 disposed between the electrode patterns defining the resonant inductors Lr1, Lr2, and Lr3 and the electrode patterns forming the capacitor C12 also serves as an inner-layer ground electrode to which the linear electrodes 191, 192, and 193 and the via holes 801, 811, 802, 812, 803, and 813 defining the resonant inductors Lr1, Lr2, and Lr3 are directly connected. Accordingly, it is possible to reduce the constituent elements of the laminate 10A than in a case where these are separately provided. This also allows the above-described laminated high-frequency filter having a superior band characteristic to have a smaller size.

Figure 8:
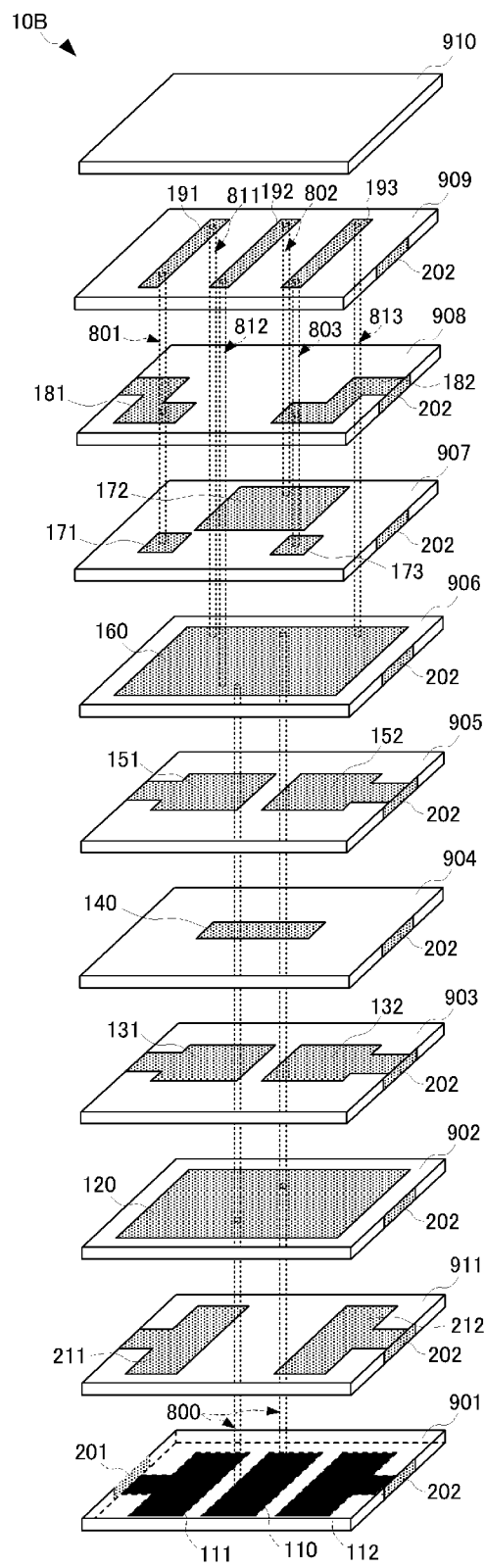
FIG. 8 is a diagram illustrating a laminated configuration of a high-frequency laminated component of a second preferred embodiment of the present invention.

Subsequently, a high-frequency laminated component according to a second preferred embodiment will be described with reference to a drawing. FIG. 8 is a diagram illustrating a laminated structure of the high-frequency laminated component of the present preferred embodiment.

In the high-frequency laminated component of the present preferred embodiment, input/output bottom surface electrodes 111 and 112 are located on a bottom surface of a laminate 10B. Further, an extra insulating layer 911 is provided between the lowermost insulating layer 901 of the laminate 10B and the insulating layer 902 including the inner-layer ground electrode 120 located at the lowermost position in the laminate. In the other configurations, the high-frequency laminated component of the present preferred embodiment is preferably the same as the high-frequency laminated component described in the foregoing first preferred embodiment, and thus description thereof will be omitted.

The bottom surface of the lowermost insulating layer 901 is provided with the input/output bottom surface electrodes 111 and 112 as well as the ground electrode 110. These input/output bottom surface electrodes 111 and 112 are arranged to sandwich the ground electrode 110. The input/output bottom surface electrode 111 is connected to the input/output electrode 201 on an end surface, and the input/output bottom surface electrode 112 is connected to the input/output electrode 202 on an end surface.

The insulating layer 911 is provided on the upper surface of the lowermost layer. The insulating layer 911 is provided with capacitor electrodes 211 and 212 each having a predetermined area. The capacitor electrode 211 is arranged to face the input/output bottom surface electrode 111 of the insulating layer 901. The capacitor electrode 212 is arranged to face the input/output bottom surface electrode 112 of the insulating layer 901. The insulating layer 911 includes a routing electrode to connect the capacitor electrode 211 and the not-illustrated input/output electrode 201 on the one end surface. The insulating layer 911 includes a routing electrode for connecting the capacitor electrode 212 and the input/output electrode 202 on the other end surface.

Similarly to the foregoing first preferred embodiment, the above-described structure is also capable of realizing a high-frequency laminated component that significantly reduces and prevents the self-resonance of the capacitor of the ground impedance adjustment circuit and improved in frequency characteristic. That is, it is possible to realize a laminated high-frequency filter having a superior band characteristic. Further, with the use of the structure of the present preferred embodiment, it is possible to significantly reduce and prevent a parasitic capacitance generated between the input/output bottom surface electrodes 111 and 112 and the inner-layer ground electrode 120, and to further improve the frequency characteristic.

Figure 9:
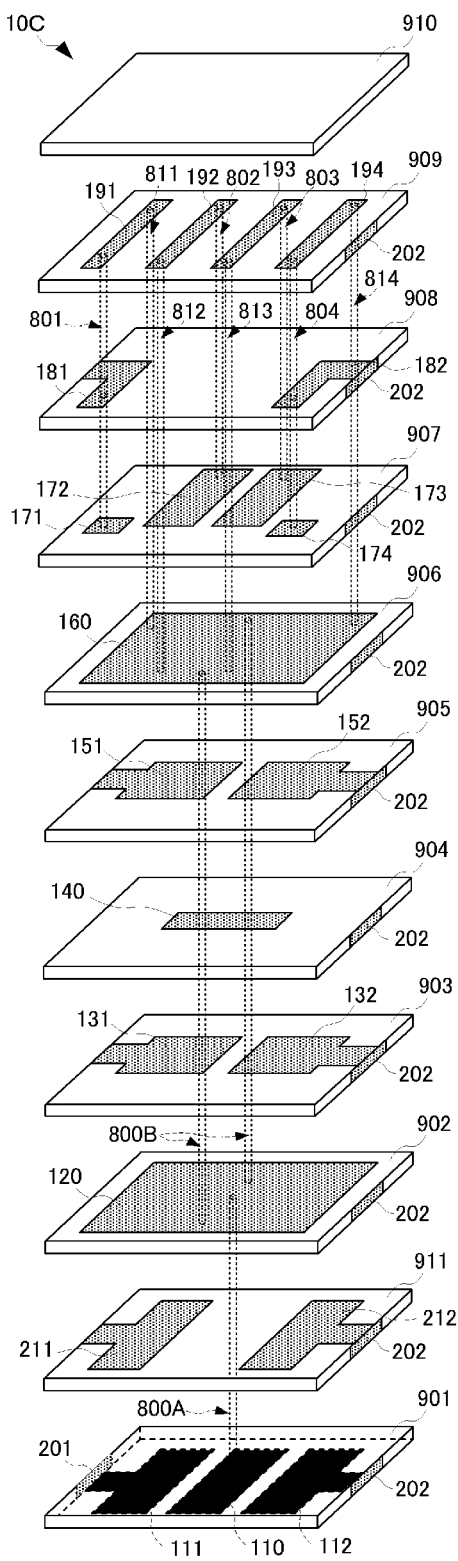
FIG. 9 is a diagram illustrating a laminated structure of a high-frequency laminated component of a third preferred embodiment of the present invention.

Subsequently, a high-frequency laminated component according to a third preferred embodiment will be described with reference to drawings. FIG. 9 is a diagram illustrating a laminated structure of the high-frequency laminated component of the present preferred embodiment.

A laminate 10C of the high-frequency laminated component of the present preferred embodiment is different from the laminate 10B of the high-frequency laminated component described in the second preferred embodiment in the number of LC resonators, which preferably is four, for example, and the structure of the via hole connecting the inner-layer ground electrode 120 and the ground electrode 110. In the other configurations, the laminate 10C preferably is the same as the laminate 10B of the high-frequency laminated component described in the foregoing second preferred embodiment. Thus, only altered portions will be described, and description of the same portions will be omitted.

The insulating layer 907 includes capacitor electrodes 171, 172, 173, and 174 each having a predetermined area.

The insulating layer 909 includes linear electrodes 191, 192, 193, and 194 for inductors. Each of the linear electrodes 191, 192, 193, and 194 has a shape extending in a direction along the end surfaces. The linear electrodes 191, 192, 193, and 194 are arranged as spaced at predetermined intervals.

Via holes 800 include via holes 800A and 800B. The via hole 800A is arranged to connect the ground electrode 110 of the insulating layer 901 and the inner-layer ground electrode 120 of the insulating layer 902. The via hole 800A is provided at one location. The via holes 800B are arranged to connect the inner-layer ground electrode 120 of the insulating layer 902 and the inner-layer ground electrode 160 of the insulating layer 906. The via holes 800B are provided at two locations near the respective facing side surfaces of the respective layers.

A via hole 801 is arranged to connect the routing electrode 181 of the insulating layer 908, the capacitor electrode 171 of the insulting layer 907, and the linear electrode 191. The via hole 801 is connected to a portion of the linear electrode 191 near one end thereof in the extending direction thereof.

A via hole 811 is arranged to connect the inner-layer ground electrode 160 of the insulating layer 906 and the linear electrode 191. The via hole 811 is connected to a portion of the linear electrode 191 near the other end thereof in the extending direction thereof.

A via hole 812 is arranged to connect the inner-layer ground electrode 160 of the insulating layer 906 and the linear electrode 192. The via hole 812 is connected to a portion of the linear electrode 192 near one end thereof in the extending direction thereof.

A via hole 802 is arranged to connect the capacitor electrode 172 of the insulating layer 907 and the linear electrode 192. The via hole 802 is connected to a portion of the linear electrode 192 near the other end thereof in the extending direction thereof.

A via hole 813 is arranged to connect the inner-layer ground electrode 160 of the insulating layer 906 and the linear electrode 193. The via hole 813 is connected to a portion of the linear electrode 193 near one end thereof in the extending direction thereof.

A via hole 803 is arranged to connect the capacitor electrode 173 of the insulating layer 907 and the linear electrode 193. The via hole 803 is connected to a portion of the linear electrode 193 near the other end thereof in the extending direction thereof.

A via hole 804 is arranged to connect the routing electrode 182 of the insulating layer 908, the capacitor electrode 174 of the insulating layer 907, and the linear electrode 194. The via hole 804 is connected to a portion of the linear electrode 194 near one end thereof in the extending direction thereof.

A via hole 814 is arranged to connect the inner-layer ground electrode 160 of the insulating layer 906 and the linear electrode 194. The via hole 814 is connected to a portion of the linear electrode 194 near the other end thereof in the extending direction thereof.

Figure 10:
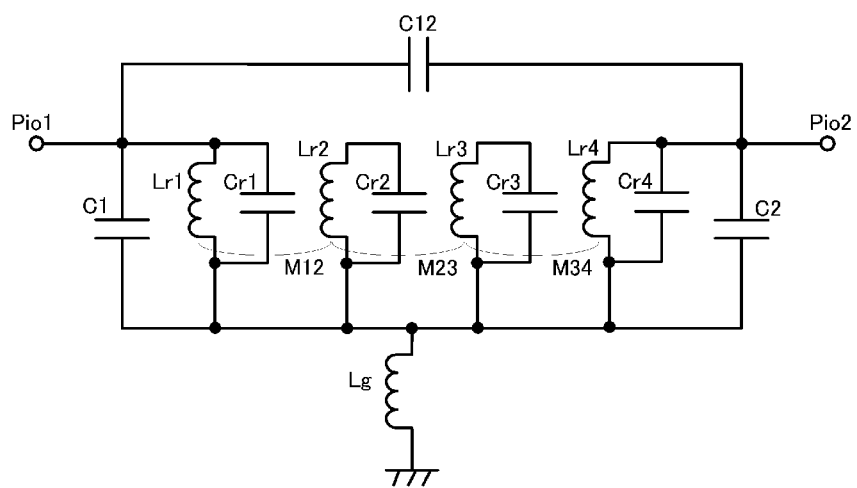
FIG. 10 is an equivalent circuit diagram of a laminated high-frequency filter corresponding to the high-frequency laminated component of the third preferred embodiment of the present invention.

FIG. 10 is an equivalent circuit diagram of a laminated high-frequency filter of the third preferred embodiment.

The input/output electrode 201 corresponds to a first input/output port Pio1 in FIG. 10, and the input/output electrode 202 corresponds to a second input/output port Pio2 in FIG. 10.

The combination of the capacitor electrode 140 and the capacitor electrodes 131 and 132 and the combination of the capacitor electrode 140 and the capacitor electrodes 151 and 152 correspond to a capacitor C12 to provide skip coupling in FIG. 10. Similarly as in the foregoing preferred embodiments, this capacitor C12 also serves as the series capacitor of the ground impedance adjustment circuit.

The linear electrode 191 and the via holes 801 and 811 correspond to a resonant inductor Lr1 in FIG. 10. As viewed from the end surface of the laminate 10C on the side of the input/output electrode 202, this resonant inductor Lr1 has a counterclockwise loop shape, with a side thereof connected to the inner-layer ground electrode 160 serving as a reference point.

The linear electrode 192 and the via holes 802 and 812 correspond to a resonant inductor Lr2 in FIG. 10. As viewed from the end surface of the laminate 10C on the side of the input/output electrode 202, this resonant inductor Lr2 has a clockwise loop shape, with a side thereof connected to the inner-layer ground electrode 160 serving as a reference point.

The linear electrode 193 and the via holes 803 and 813 correspond to a resonant inductor Lr3 in FIG. 10. As viewed from the end surface of the laminate 10C on the side of the input/output electrode 202, this resonant inductor Lr3 has a clockwise loop shape, with a side thereof connected to the inner-layer ground electrode 160 serving as a reference point.

The linear electrode 194 and the via holes 804 and 814 correspond to a resonant inductor Lr4 in FIG. 10. As viewed from the end surface of the laminate 10C on the side of the input/output electrode 202, this resonant inductor Lr4 has a counterclockwise loop shape, with a side thereof connected to the inner-layer ground electrode 160 serving as a reference point.

The linear electrode 191 with the via holes 801 and 811 and the linear electrode 192 with the via holes 802 and 812 are disposed at a predetermined interval, to thereby realize coupling inductance M12 in FIG. 10.

The linear electrode 192 with the via holes 802 and 812 and the linear electrode 193 with the via holes 803 and 813 are disposed at a predetermined interval, to thereby realize coupling inductance M23 in FIG. 10.

The linear electrode 193 with the via holes 803 and 813 and the linear electrode 194 with the via holes 804 and 814 are disposed at a predetermined interval, to thereby realize coupling inductance M34 in FIG. 10.

The combination of the capacitor electrode 171 and the inner-layer ground electrode 160, the combination of the capacitor electrode 151 and the inner-layer ground electrode 160, and the combination of the capacitor electrode 131 and the inner-layer ground electrode 120 correspond to a resonant capacitor Cr1 in FIG. 10. The combination of the capacitor electrode 172 and the inner-layer ground electrode 160 corresponds to a resonant capacitor Cr2 in FIG. 10. The combination of the capacitor electrode 173 and the inner-layer ground electrode 160 corresponds to a resonant capacitor Cr3 in FIG. 10. The combination of the capacitor electrode 174 and the inner-layer ground electrode 160, the combination of the capacitor electrode 152 and the inner-layer ground electrode 160, and the combination of the capacitor electrode 132 and the inner-layer ground electrode 120 correspond to a resonant capacitor Cr4 in FIG. 10.

The combination of the capacitor electrode 131 and the inner-layer ground electrode 120 and the combination of the capacitor electrode 151 and the inner-layer ground electrode 160 correspond to a capacitor C1 in FIG. 10.

The combination of the capacitor electrode 132 and the inner-layer ground electrode 120 and the combination of the capacitor electrode 152 and the inner-layer ground electrode 160 correspond to a capacitor C2 in FIG. 10.

As described above, with the above-described structure as illustrated in FIG. 9, the laminate 10C of the present preferred embodiment is capable of configuring a band pass filter including four stages of LC resonators as illustrated in the equivalent circuit of FIG. 10.

Similarly to the foregoing preferred embodiments, the above-described configuration is also capable of improving the frequency characteristic. Further, if the number of via holes directly connected to the ground electrode 110 is changed, as in the present preferred embodiment, it is possible to further improve the attenuation characteristic near the pass band.

Further, also in the structure of the present preferred embodiment, the inner-layer ground electrode 160 is provided between the linear electrode 191 and the via holes 801 and 811 of the resonant inductor Lr1, the linear electrode 192 and the via holes 802 and 812 of the resonant inductor Lr2, the linear electrode 193 and the via holes 803 and 813 of the resonant inductor Lr3, and the linear electrode 194 and the via holes 804 and 814 of the resonant inductor Lr4 and the capacitor electrode 140 of the skip-coupling capacitor. Thereby, the capacitor electrode 140 of the skip-coupling capacitor does not affect electromagnetic field coupling of the resonant inductors Lr1, Lr2, Lr3, and Lr4. Accordingly, it is possible to significantly reduce and prevent the loss in the coupling of the resonant inductors Lr1, Lr2, Lr3, and Lr4, and to reduce the insertion loss of the filter. Accordingly, it is possible to realize a laminated high-frequency filter having a superior band characteristic.

Figure 11:
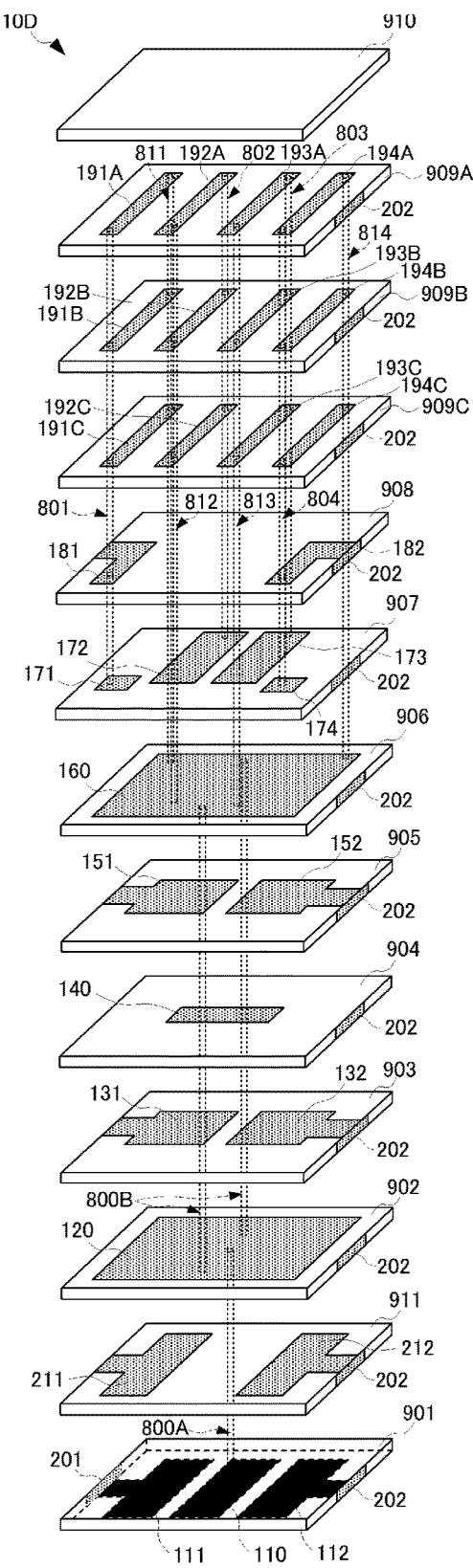
FIG. 11 is a diagram illustrating a laminated structure of a high-frequency laminated component of a fourth preferred embodiment of the present invention.

Subsequently, a high-frequency laminated component according to a fourth preferred embodiment will be described with reference to drawings. FIG. 11 is a diagram illustrating a laminated structure of the high-frequency laminated component of the present preferred embodiment.

A laminate 10D of the high-frequency laminated component of the present preferred embodiment is different from the laminate 10C of the high-frequency laminated component described in the third preferred embodiment in the shape of the inductors of the LC resonators. In the other configurations, the laminate 10D preferably is the same as the laminate 10C of the high-frequency laminated component described in the foregoing third preferred embodiment. Thus, only altered portions will be described, and description of the same portions will be omitted.

The laminate 10D of the present preferred embodiment preferably includes three insulating layers including linear electrodes to define inductors. An insulating layer 909C is provided on the insulating layer 908 including the routing electrodes 181 and 182. The insulating layer 909C includes linear electrodes 191C, 192C, 193C, and 194C to define inductors. Each of the linear electrodes 191C, 192C, 193C, and 194C has a shape extending in a direction along the end surfaces. The linear electrodes 191C, 192C, 193C, and 194C are spaced at predetermined intervals.

An insulating layer 909B is provided on the insulating layer 909C. The insulating layer 909B is provided with linear electrodes 191B, 192B, 193B, and 194B to define inductors. The linear electrodes 191B, 192B, 193B, and 194B of the insulating layer 909B are arranged to overlap the linear electrodes 191C, 192C, 193C, and 194C of the insulating layer 909C, respectively, as viewed along the lamination direction.

An insulating layer 909A is provided on the insulating layer 909B. The insulating layer 909A includes linear electrodes 191A, 192A, 193A, and 194A for inductors. The linear electrodes 191A, 192A, 193A, and 194A of the insulating layer 909A are arranged to overlap the linear electrodes 191B, 192B, 193B, and 194B of the insulating layer 909B and the linear electrodes 191C, 192C, 193C, and 194C of the insulating layer 909C, respectively, as viewed along the lamination direction.

Via holes 801 and 811 are arranged to establish electrical continuity between the linear electrodes 191A, 191B, and 191C. Via holes 802 and 812 are arranged to establish electrical continuity between the linear electrodes 192A, 192B, and 192C. Via holes 803 and 813 are arranged to establish electrical continuity between the linear electrodes 193A, 193B, and 193C. Via holes 804 and 814 are arranged to establish electrical continuity between the linear electrodes 194A, 192B, and 194C.

Figures 12A, 12B:
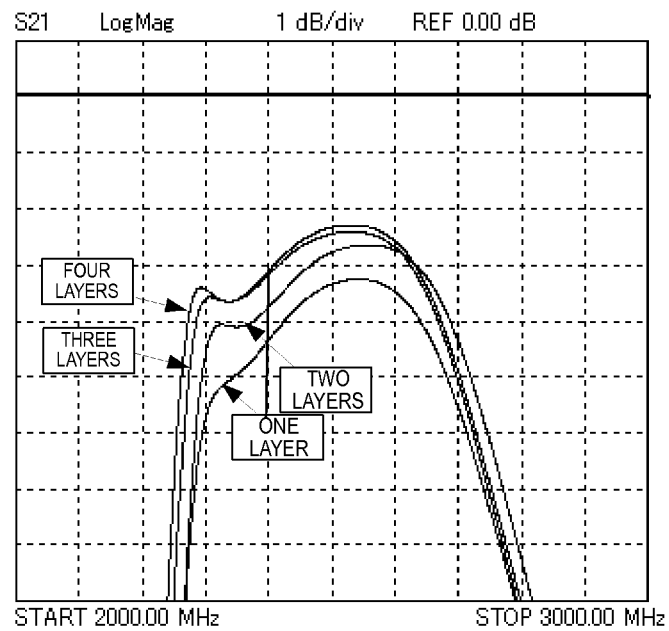
FIGS. 12A and 12B are a table illustrating changes in insertion loss according to the number of layers of an inductor, and an enlarged view of transmission characteristics in a pass band.

With the above-described configuration, the resonant inductors Lr1, Lr2, Lr3, and Lr4 have a three-layer structure, and the degree of coupling between the resonant inductors is more improved than in a single-layer structure. Accordingly, the insertion loss is reduced, and the transmission characteristic is improved. FIG. 12A is a table illustrating changes in insertion loss according to the number of layers of an inductor, and FIG. 12B is an enlarged view of transmission characteristics in the pass band. As observed from FIGS. 12A and 12B, it is possible to improve the insertion loss and the transmission characteristic by increasing the number of layers of an inductor. Accordingly, it is possible to further improve characteristics of the high-frequency laminated component.

Figure 13:
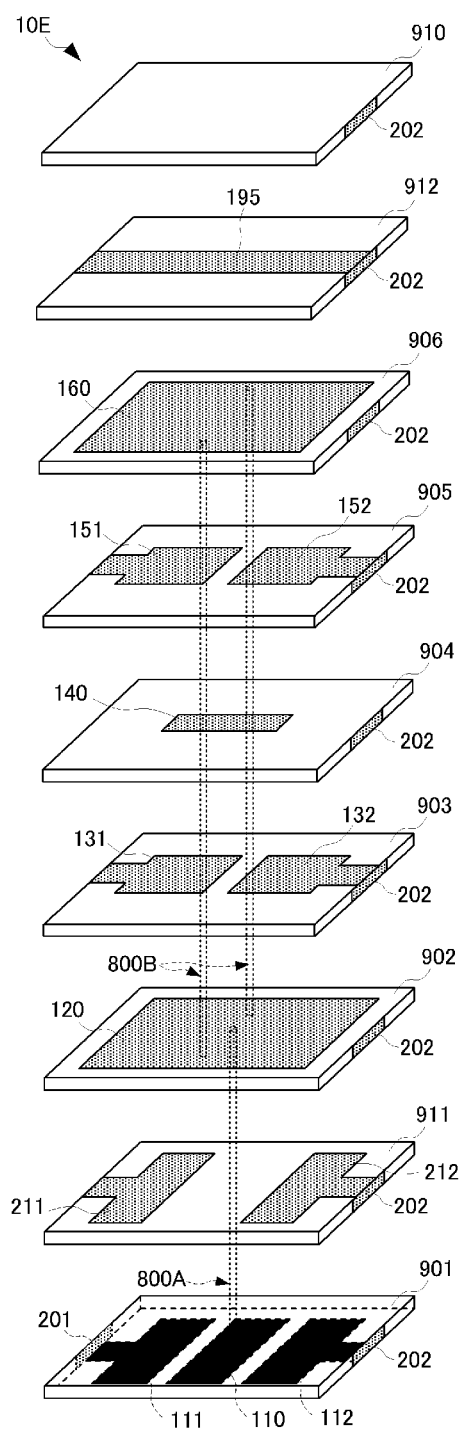
FIG. 13 is a diagram illustrating a laminated structure of a high-frequency laminated component of a fifth preferred embodiment of the present invention.

Subsequently, a high-frequency laminated component according to a fifth preferred embodiment will be described with reference to drawings. FIG. 13 is a diagram illustrating a laminated structure of the high-frequency laminated component of the present preferred embodiment.

A laminate 10E of the high-frequency laminated component of the present preferred embodiment is different from the laminate 10C of the high-frequency laminated component described in the third preferred embodiment in the configuration of the layer corresponding to a circuit function section. In the other configurations, the laminate 10E preferably is the same as the laminate 10C of the high-frequency laminated component described in the foregoing third preferred embodiment. Thus, only altered portions will be described, and description of the same portions will be omitted.

The structure of the insulating layers 901, 911, 902, 903, 904, 905, and 906 and the uppermost insulating layer 910 is the same as that of the laminate 10C of the high-frequency laminated component of the third preferred embodiment. In the configuration of the present preferred embodiment, the uppermost insulating layer 910 is provided with the input/output electrodes 201 and 202. As well as in the foregoing preferred embodiments, the insulating layer 910 may be or may not be provided with these input/output electrodes 201 and 202.

An insulating layer 912 is provided on the insulating layer 906 provided with the inner-layer ground electrode 160. The insulating layer 912 is provided with a linear electrode 195 having a rectilinear shape and a predetermined width and providing electrical continuity between the input/output electrodes 201 and 202. This linear electrode 195 functions as an inductor.

Figure 14:
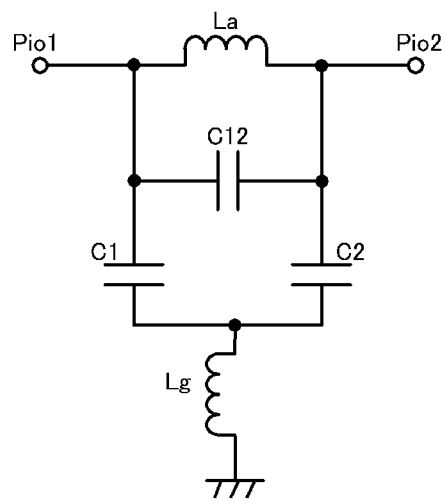
FIG. 14 is an equivalent circuit diagram of the high-frequency laminated component defined by a laminate 10E.

FIG. 14 is an equivalent circuit diagram of the high-frequency laminated component defined by the laminate 10E. As illustrated in FIG. 14, the high-frequency laminated component defined by the laminate 10E functions as a low pass filter (LPF) having an inductor La which is connected in series between the input/output terminals Pio1 and Pio2, and to which the ground impedance adjustment circuit is connected in parallel.

Figure 15:
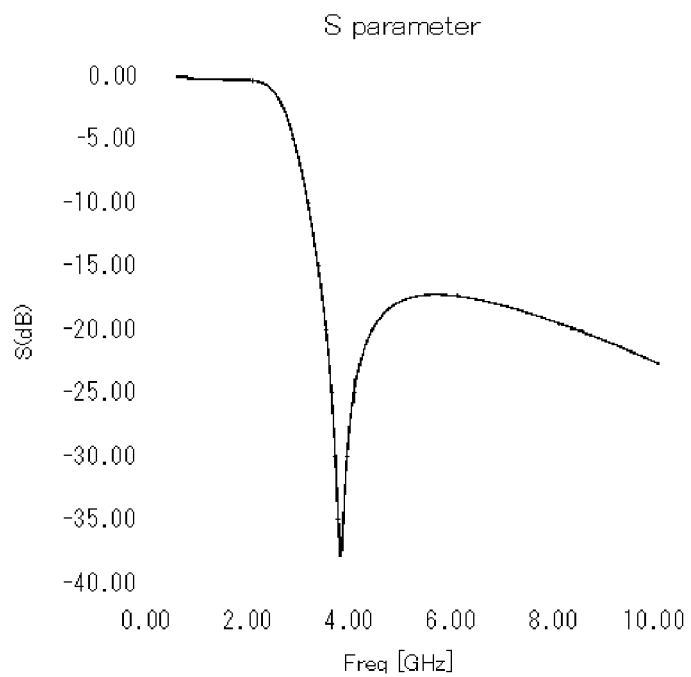
FIG. 15 is a transmission characteristic diagram of a low pass filter defined by the laminate 10E.

FIG. 15 is a transmission characteristic diagram of the low pass filter defined by the laminate 10E. As illustrated in FIG. 15, the use of the structure of the present preferred embodiment improves the attenuation characteristic on the high-band side, and makes it possible to configure a low pass filter having a superior frequency characteristic.

Figure 16:
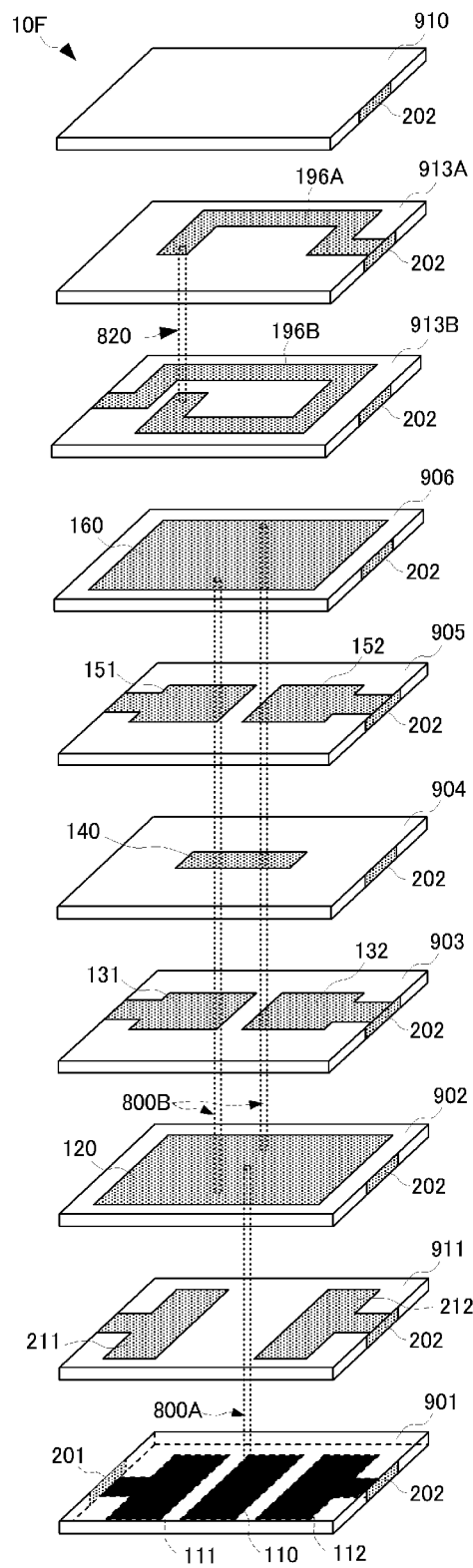
FIG. 16 is a diagram illustrating a laminated structure of a high-frequency laminated component of a sixth preferred embodiment of the present invention.

Subsequently, a high-frequency laminated component according to a sixth preferred embodiment will be described with reference to a drawing. FIG. 16 is a diagram illustrating a laminated structure of the high-frequency laminated component of the present preferred embodiment.

A laminate 10F of the high-frequency laminated component of the present preferred embodiment is different from the laminate 10E of the fifth preferred embodiment in the configuration of the layers corresponding to the circuit function section. In the other configurations, the laminate 10F preferably is the same as the laminate 10E of the high-frequency laminated component described in the foregoing fifth preferred embodiment. Thus, only altered portions will be described, and description of the same portions will be omitted.

The structure of the insulating layers 901, 911, 902, 903, 904, 905, and 906 and the uppermost insulating layer 910 is the same as that of the laminate 10E.

An insulating layer 913B is provided on the insulating layer 906 including the inner-layer ground electrode 160. The insulating layer 913B is provided with a winding linear electrode 196B winding clockwise from the outside to the inside, as viewed from above. The input/output electrode 201 is connected to a portion of the winding linear electrode 196B near the outermost circumferential end thereof.

An insulating layer 913A is provided on the insulating layer 913B. The insulating layer 913A is provided with a linear electrode 196A having a shape winding to be connected to the aforementioned winding linear electrode 196B, as viewed from above. A portion of the linear electrode 196A near one end thereof is connected by a via hole 820 to a portion of the linear electrode 196B of the insulating layer 913B near the innermost circumferential end thereof. The other end of the linear electrode 196A is connected to the input/output electrode 202.

Similarly to the foregoing fifth preferred embodiment, the above-described structure is also capable of configuring a low pass filter having a superior frequency characteristic.

Figure 17:
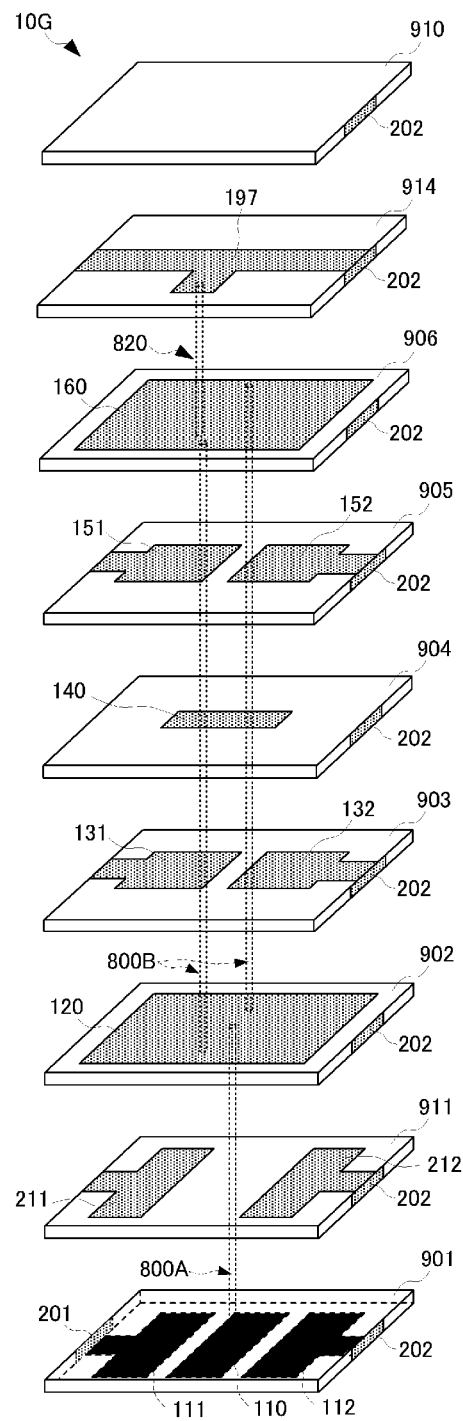
FIG. 17 is a diagram illustrating a laminated structure of a high-frequency laminated component of a seventh preferred embodiment of the present invention.

Subsequently, a high-frequency laminated component according to a seventh preferred embodiment will be described with reference to drawings. FIG. 17 is a diagram illustrating a laminated structure of the high-frequency laminated component of the present preferred embodiment.

A laminate 10G of the high-frequency laminated component of the present preferred embodiment is different from the laminate 10E of the fifth preferred embodiment in the configuration of the layer corresponding to the circuit function section. In the other configurations, the laminate 10G is the same as the laminate 10E of the high-frequency laminated component described in the foregoing third preferred embodiment. Thus, only altered portions will be described, and description of the same portions will be omitted.

An insulating layer 914 is provided on the insulating layer 906 provided with the inner-layer ground electrode 160. The insulating layer 914 is provided with a T-shaped electrode 197. The T-shaped electrode 197 is an electrode having a shape extending along three directions defining angles of approximately 90° therebetween, as viewed from above. One of two linear electrodes of the T-shaped electrode 197 parallel to each other in the extending direction is connected to the input/output electrode 201, and the other linear electrode is connected to the input/output electrode 202. A remaining linear electrode of the T-shaped electrode 197 preferably has a predetermined length that prevents the linear electrode from being exposed to a side surface of the laminate, and is connected to the inner-layer ground electrode 160 via a via hole 820.

Figure 18:
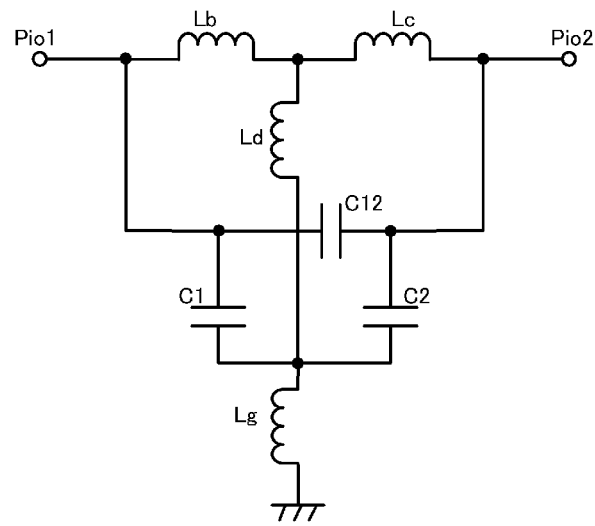
FIG. 18 is an equivalent circuit diagram of the high-frequency laminated component defined by a laminate 10G.

FIG. 18 is an equivalent circuit diagram of the high-frequency laminated component formed by the laminate 10G. As illustrated in FIG. 18, the high-frequency laminated component formed by the laminate 10G functions as a T-shaped band pass filter (BPF) including a series circuit of inductors Lb and Lc connected between the input/output terminals Pio1 and Pio2 and an inductor Ld connected between a connection point of the inductors Lb and Lc and the ground.

Figure 19:
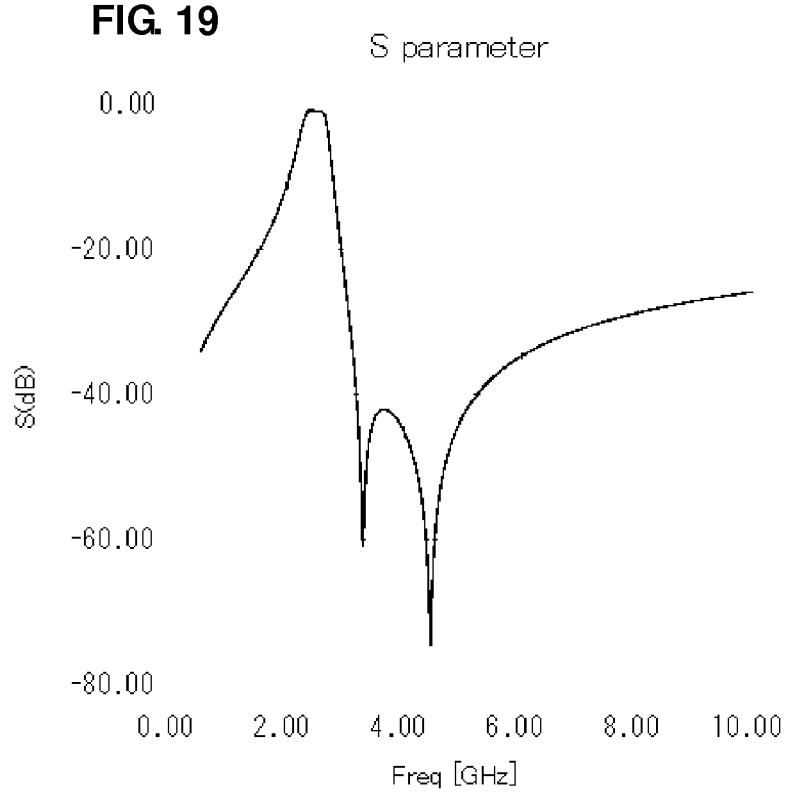
FIG. 19 is a transmission characteristic diagram of a band pass filter defined by the laminate 10G.

FIG. 19 is a transmission characteristic diagram of the band pass filter defined by the laminate 10G. As illustrated in FIG. 19, the use of the structure of the present preferred embodiment improves the attenuation characteristic on the high-band side of the pass band, and makes it possible to configure a band pass filter having a superior frequency characteristic. Further, the present preferred embodiment is capable of linearly defining the inductors Lb and Lc and thus configuring a band pass filter having a low loss. Herein, it is possible to adjust the inductance between the inductors Lb and Lc to an optimum value by changing the connection position of the via hole 820.

Figure 20:
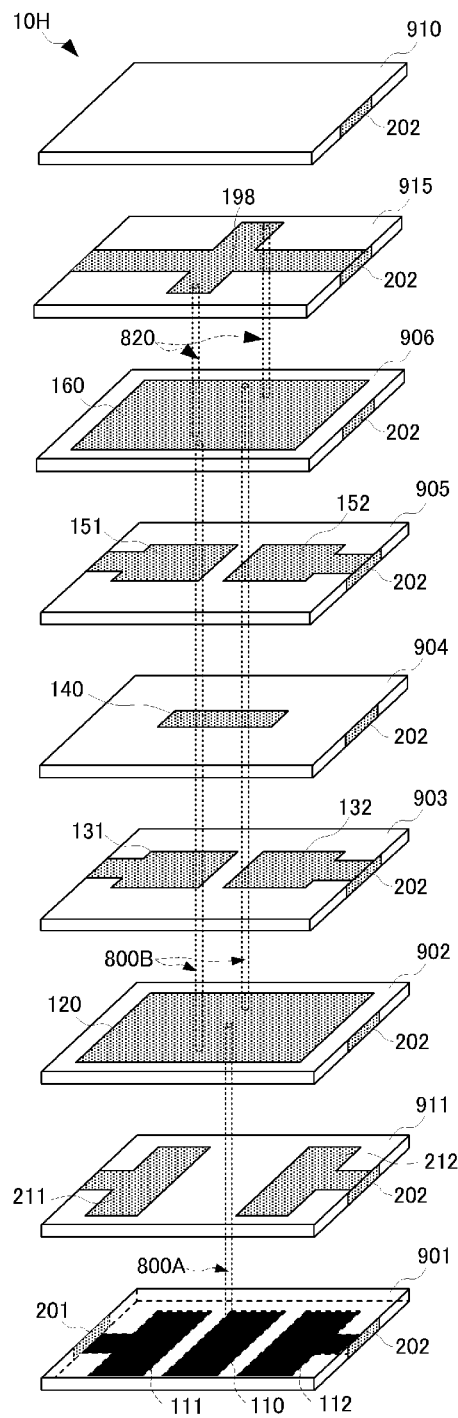
FIG. 20 is a diagram illustrating a laminated structure of a high-frequency laminated component of an eighth preferred embodiment of the present invention.

Subsequently, a high-frequency laminated component according to an eighth preferred embodiment will be described with reference to drawings. FIG. 20 is a diagram illustrating a laminated structure of the high-frequency laminated component of the present preferred embodiment.

A laminate 10H of the high-frequency laminated component of the present preferred embodiment is different from the laminate 10G of the seventh preferred embodiment in the configuration of the layer corresponding to the circuit function section. In the other configurations, the laminate 10H preferably is the same as the laminate 10G of the high-frequency laminated component described in the foregoing seventh preferred embodiment. Thus, only altered portions will be described, and description of the same portions will be omitted.

The structure of the insulating layers 901, 911, 902, 903, 904, 905, and 906 and the uppermost insulating layer 910 is the same as that of the laminate 10G.

An insulating layer 915 is provided on the insulating layer 906 including the inner-layer ground electrode 160. The insulating layer 915 includes a cross-shaped electrode 198. The cross-shaped electrode 198 is an electrode having a shape extending along four directions defining angles of approximately 90° therebetween (cross shape), as viewed from above. In pairs of linear electrodes of the cross-shaped electrode 198 parallel to each other in the extending direction, the linear electrodes of one of the pairs are connected to the input/output electrodes 201 and 202. The linear electrodes of the remaining pair of the cross-shaped electrode 198 are arranged to extend in mutually opposite directions with a predetermined length that prevents the linear electrodes from being exposed to the side surfaces of the laminate.

Figure 21:
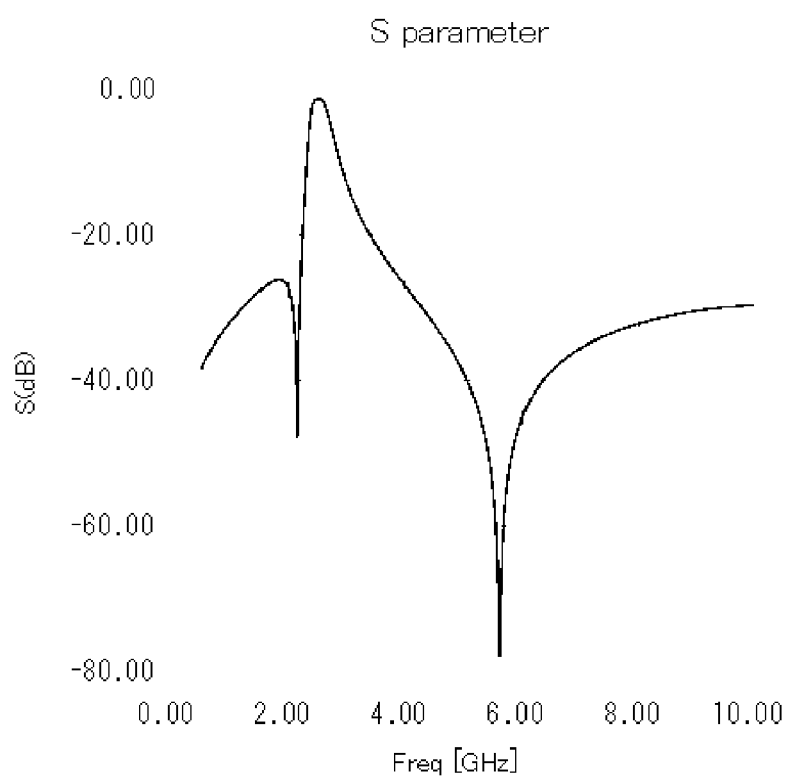
FIG. 21 is a transmission characteristic diagram of a band pass filter defined by the laminate 10H.

FIG. 21 is a transmission characteristic diagram of a band pass filter defined by the laminate 10H. As illustrated in FIG. 21, the use of the structure of the present preferred embodiment also improves the attenuation characteristic on the high-band side of the pass band, and makes it possible to configure a band pass filter having a superior frequency characteristic. Further, the present preferred embodiment is capable of linearly defining the inductors Lb and Lc and thus configuring a band pass filter having a low loss. Herein, it is possible to adjust the inductance between the inductors Lb and Lc to an optimum value by changing the connection position of via holes 820.

Figure 22:
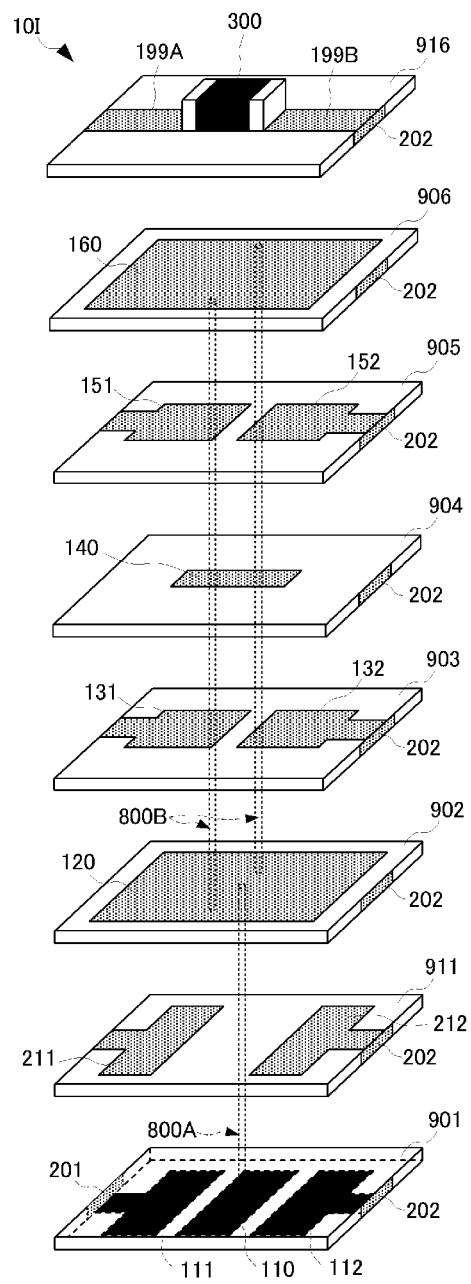
FIG. 22 is a diagram illustrating a laminated structure of a high-frequency laminated component of a ninth preferred embodiment of the present invention.

Subsequently, a high-frequency laminated component according to a ninth preferred embodiment will be described with reference to drawings. FIG. 22 is a diagram illustrating a laminated structure of the high-frequency laminated component of the present preferred embodiment.

A laminate 10I of the high-frequency laminated component of the present preferred embodiment is different from the laminate 10E of the fifth preferred embodiment in the configuration of the layer corresponding to the circuit function section, and the insulating layer provided with the circuit function section defines the uppermost layer. In the other configurations, the laminate 10I preferably is the same as the laminate 10E of the high-frequency laminated component described in the foregoing fifth preferred embodiment. Thus, only altered portions will be described, and description of the same portions will be omitted.

The structure of the insulating layers 901, 911, 902, 903, 904, 905, and 906 preferably is the same as that of the laminate 10E.

An insulating layer 916 is provided on the insulating layer 906 provided with the inner-layer ground electrode 160. The insulating layer 916 is provided with routing electrodes 199A and 199B having a rectilinear shape and a predetermined width and being in electrical continuity with the input/output electrodes 201 and 202, respectively. A chip inductor 300 is mounted on mutually facing end portions of these routing electrodes 199A and 199B.

Similarly to the foregoing fifth preferred embodiment, the above-described structure is also capable of configuring a high-frequency laminated component having a superior frequency characteristic. Further, with the configuration of the present preferred embodiment, it is possible to configure a high-frequency laminated component being superior in frequency characteristic and having different characteristics by replacing the chip inductor 300 with another circuit device (such as a chip inductor or a filter device having different inductance). That is, it is possible to easily provide plural types of high-frequency laminated components superior in frequency characteristic.

Figure 23:
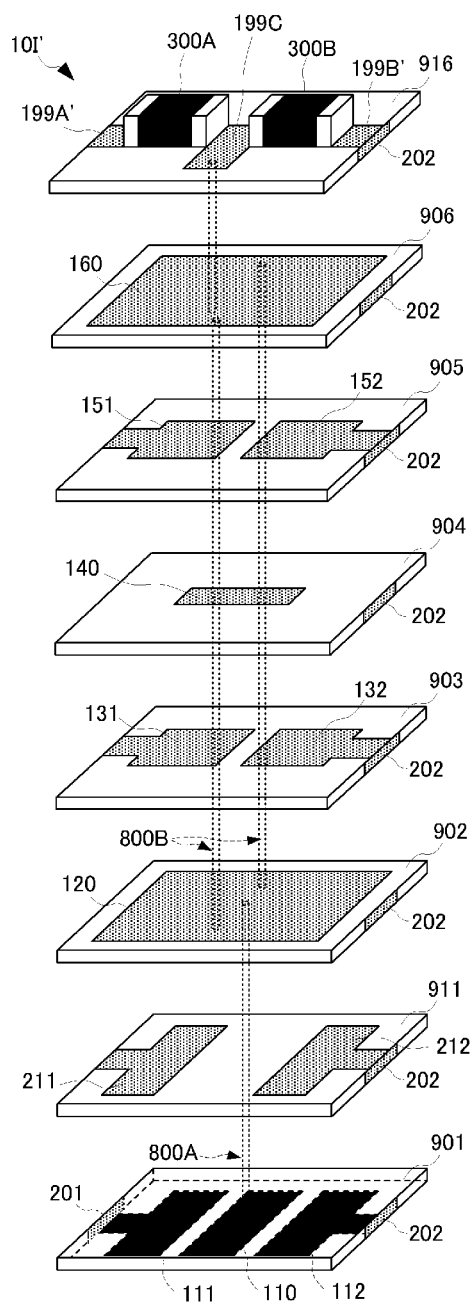
FIG. 23 is a diagram illustrating another laminated structure (laminate 10I') of the high-frequency laminated component of the ninth preferred embodiment of the present invention.

In FIG. 22, the structure is configured to allow another circuit device to be mounted thereon on the basis of the configuration of the fifth preferred embodiment. As illustrated in FIG. 23, however, a high-frequency laminated component may be provided which has a similar configuration allowing another circuit device to be mounted thereon on the basis of the configuration of the seventh preferred embodiment. FIG. 23 is a diagram illustrating another laminated structure (laminate 10I') of the high-frequency laminated component of the present preferred embodiment. A high-frequency laminated component may be provided which has a similar configuration allowing another circuit device to be mounted thereon on the basis of the configuration of the eighth preferred embodiment. With the configuration as in FIG. 23, it is possible to configure the circuit function section by combining mounted circuit devices and linear electrodes.

Figure 24:
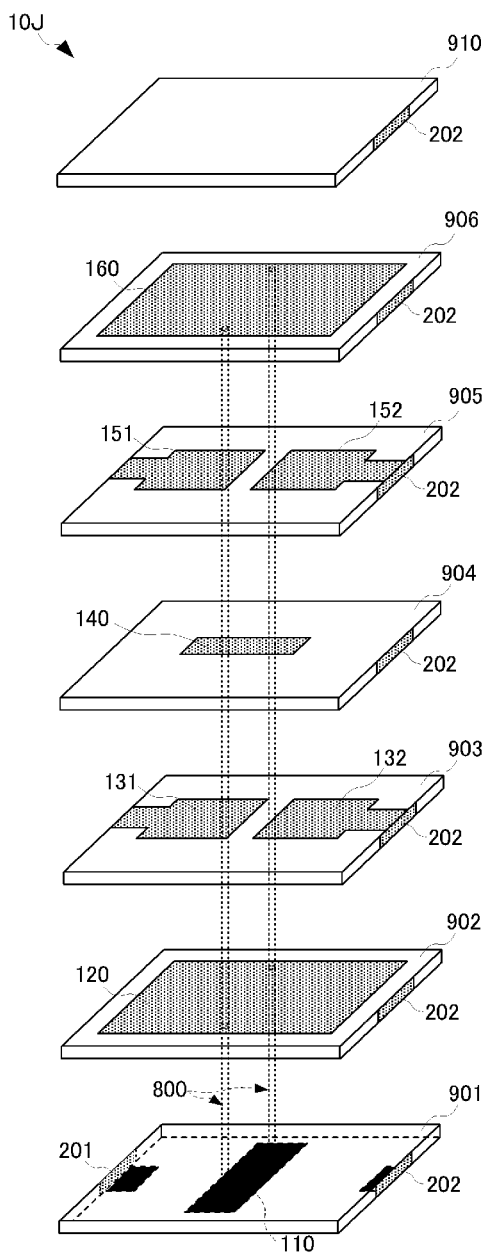
FIG. 24 is a diagram illustrating a laminated structure of a high-frequency laminated component of a tenth preferred embodiment of the present invention.

Subsequently, a high-frequency laminated component according to a tenth preferred embodiment will be described with reference to drawings. FIG. 24 is a diagram illustrating a laminated structure of the high-frequency laminated component of the present preferred embodiment.

In the foregoing preferred embodiments, description has been made of the example in which the ground impedance adjustment circuit and the circuit function section are integrally provided in the laminate. As will be described in the present preferred embodiment, however, a structure including only the ground impedance adjustment circuit in the laminate may be used, for example.

As illustrated in FIG. 24, a laminate 10J of the high-frequency laminated component of the present preferred embodiment has a structure corresponding to a portion of the laminate 10B of the first preferred embodiment illustrated in FIG. 5, in which the insulating layers 907, 908, and 909 are omitted.

With the above-described structure, it is possible to form a high-frequency laminated component including the ground impedance adjustment circuit alone. Further, if such a high-frequency laminated component is mounted on a circuit board to be in proximity to a separate filter device component, it is possible to improve the frequency characteristic of the separate filter device component. Further, it is also possible to provide this ground impedance adjustment circuit in a circuit board and thereby reduce the size of the entire component.

Figure 25:
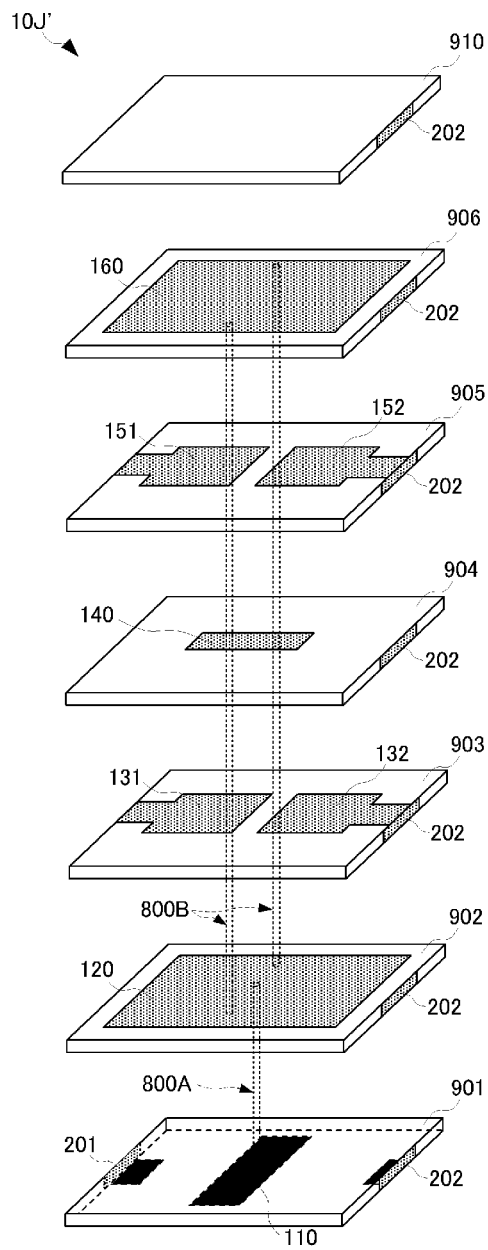
FIG. 25 is a diagram illustrating another laminated structure of the high-frequency laminated component of the tenth preferred embodiment of the present invention.

Further, also in the above-described high-frequency laminated component including only the ground impedance adjustment circuit, the number of via holes between the inner-layer ground electrode 120 of the lowermost layer and the ground electrode 110 and the number of via holes above the inner-layer ground electrode 120 may be set differently, as described in the foregoing third preferred embodiment and so forth. FIG. 25 is a diagram illustrating another laminated structure of the high-frequency laminated component of the present preferred embodiment.

In the foregoing preferred embodiments including the circuit function section, description has been made of the example in which the capacitors for the LC resonators and the capacitors of the ground impedance adjustment circuit are separately provided. However, the first parallel capacitor C1 and the second parallel capacitor C2 of the ground impedance adjustment circuit may be configured to also serve as the capacitors of the LC resonators at the opposite ends of a plurality of sequential LC resonators. As a result, the constituent elements of the laminate are reduced, and it is possible to provide the laminate in a simpler and smaller structure.

Further, in the foregoing preferred embodiments of filters including the circuit function section, there are cases where capacitance to perform skip coupling is set between the input/output terminals Pio1 and Pio2. In these cases, the series capacitor C12 of the ground impedance adjustment circuit is capable of also serving as the capacitance for skip coupling. As a result, the constituent elements of the laminate are reduced, and it is possible to form the laminate in a simpler and smaller structure.

Further, in the foregoing structures, the electrodes for the capacitors of the LC resonators are appropriately set to obtain desired capacitance. When determining the shape of the electrodes for the capacitors in accordance with the capacitance, however, it is more preferred to arrange the electrodes so as not to overlap, at least simultaneously, both of adjacent linear electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency laminated component comprising:
    a pair of input/output terminals;
    a circuit function section connected between the pair of input/output terminals and performing a predetermined function;
    a ground impedance adjustment circuit defined by a series capacitor connected between the pair of input/output terminals, and a first parallel capacitor and a second parallel capacitor respectively connected between opposite ends of the series capacitor and a ground electrode; and
    an inductor that connects the first parallel capacitor and the second parallel capacitor to the ground electrode; wherein
    the ground impedance adjustment circuit is defined by a laminate of a plurality of laminated insulating layers including predetermined electrode patterns;
    at least two inner-layer ground electrodes respectively located on different insulating layers of the laminate are provided;
    electrodes defining the parallel capacitors are disposed between the at least two inner-layer ground electrodes;
    the series capacitor is defined by opposite electrodes facing each other;
    the first parallel capacitor and the second parallel capacitor are each defined by opposite electrodes facing each other; and
    one of the opposite electrodes of the first parallel capacitor and the second parallel capacitor also serves as one of the opposite electrodes of the series capacitor.

2. The laminated high-frequency filter described in claim 1, wherein the at least two inner-layer ground electrodes are connected to each other by a via conductor.

3. The high-frequency laminated component described in claim 1, wherein
    the other one of the opposite electrodes of the first parallel capacitor and the second parallel capacitor is defined by one of the at least two inner-layer ground electrodes;
    the inductor is connected between the one of the at least two inner-layer ground electrodes and the ground electrode; and
    the one of the opposite electrodes of the first parallel capacitor and the second parallel capacitor that serves as one of the opposite electrodes of the series capacitor is disposed between the at least two inner-layer ground electrodes.

4. The high-frequency laminated component described in claim 1, wherein the circuit function section is defined by a mounted component mounted on the laminate, and the laminate is provided with a mounting land to mount the mounted component.

5. The high-frequency laminated component described in claim 1, wherein the circuit function section is a filter having a predetermined frequency transmission characteristic.

6. The high-frequency laminated component described in claim 1, wherein the circuit function section is defined by electrode patterns located on the plurality of insulating layers.

7. The high-frequency laminated component described in claim 6, wherein at least one of the series capacitor, the first parallel capacitor, and the second parallel capacitor defining the ground impedance adjustment circuit also serves as a capacitor that is included in the circuit function section.

8. A laminated high-frequency filter comprising:
    a pair of input/output terminals;
    a plurality of stages of LC resonators connected between the pair of input/output terminals;
    an input capacitor and an output capacitor respectively connected between the pair of input/output terminals and a ground electrode;
    an inductor that connects the input capacitor and the output capacitor to the ground electrode; and
    a skip-coupling capacitor directly connected between the pair of input/output terminals; wherein
    inductors and capacitors defining the LC resonators and the skip-coupling capacitor are defined by a laminate of a plurality of laminated insulating layers provided with predetermined electrode patterns;
    the laminate includes a first inner-layer ground electrode provided on one of the insulating layers;
    the first inner-layer ground electrode is provided between electrode patterns defining the inductors and electrode patterns forming the skip-coupling capacitor;
    the electrode patterns forming the skip-coupling capacitor are opposite electrodes facing each other;
    the input capacitor and the output capacitor are each defined by opposite electrodes facing each other; and
    one of the opposite electrodes of the input capacitor and the output capacitor also serves as one of the opposite electrodes of the skip-coupling capacitor.

9. The laminated high-frequency filter described in claim 8, further comprising:
- a ground impedance adjustment circuit defined by a series capacitor connected between the pair of input/output terminals, and a first parallel capacitor and a second parallel capacitor respectively connected between the opposite ends of the series capacitor and the ground electrode; wherein
- the electrode patterns defining the skip-coupling capacitor also serve as the series capacitor; and
- the input capacitor and the output capacitor respectively connected between the pair of input/output terminals and the ground electrode serve as the first parallel capacitor and the second parallel capacitor.

10. The laminated high-frequency filter described in claim 8, wherein
- at least the skip-coupling capacitor is sandwiched by the first inner-layer ground electrode and a second inner-layer ground electrode, the first and second inner-layer ground electrodes provided on different insulating layers.

11. The laminated high-frequency filter described in claim 10, wherein electrode patterns of the opposite electrodes defining the input capacitor and the output capacitor are also sandwiched by the first and second inner-layer ground electrodes provided on the different insulating layers.

12. The laminated high-frequency filter described in claim 10, wherein the first inner-layer ground electrode and the second inner-layer ground electrode are connected to each other by a via conductor.

13. The laminated high-frequency filter described in claim 8, wherein opposite ends of the electrode patterns in the inductors of the LC resonators are provided with via conductors to be connected to the capacitors of the LC resonators and the first inner-layer ground electrode, and each of the inductors is defined by the electrode pattern of the inductor and two via conductors.

14. The laminated high-frequency filter described in claim 13, wherein the electrode patterns defining the inductors are provided on the plurality of insulating layers, and each of the electrode patterns provided on the plurality of insulating layers is connected in parallel through the two via conductors.

15. The laminated high-frequency filter described in claim 13, wherein the first inner-layer ground electrode to which the electrode patterns of the inductors are connected is provided on a predetermined insulating layer different from a bottom surface of the laminate.

16. The laminated high-frequency filter described in claim 13, wherein a respective pair of via conductors connecting the electrode patterns of each inductor are located at respective positions at which the via conductors substantially overlap one another, as viewed from a side surface of the laminate.

17. The laminated high-frequency filter described in claim 13, wherein, in arbitrary adjacent inductors of the inductors defining the plurality of LC resonators, positions of the via conductors connected to the electrode patterns and the capacitors are located at different end portions.

18. The laminated high-frequency filter described in claim 8, wherein the electrode patterns of arbitrary adjacent inductors of the inductors defining the plurality of LC inductors are located on the same insulating layer.

19. The laminated high-frequency filter described in claim 8, wherein the ground electrode is an external ground electrode to be connected to an external ground, and the external ground electrode and external input/output terminals defining the pair of input/output terminals are arranged in an array on a bottom surface of the laminate.

* * * * *